(12) United States Patent
Forbes

(10) Patent No.: US 6,744,094 B2
(45) Date of Patent: Jun. 1, 2004

(54) FLOATING GATE TRANSISTOR WITH HORIZONTAL GATE LAYERS STACKED NEXT TO VERTICAL BODY

(75) Inventor: Leonard Forbes, Corvallis, OR (US)

(73) Assignee: Micron Technology Inc., Boise, ID (US)

(*) Notice: Subject to any disclaimer, the term of this patent is extended or adjusted under 35 U.S.C. 154(b) by 0 days.

(21) Appl. No.: 09/939,417

(22) Filed: Aug. 24, 2001

(65) Prior Publication Data

US 2003/0038318 A1 Feb. 27, 2003

(51) Int. Cl.[7] ............................................. H01L 29/788
(52) U.S. Cl. ...................... 257/315; 257/314; 257/316; 257/321
(58) Field of Search ................................ 257/314–316, 257/321, 331, 302, 296, 330, 334, 304, 347; 438/342, 259, 242

(56) References Cited

U.S. PATENT DOCUMENTS

| | | | | |
|---|---|---|---|---|
| 5,379,255 A | * | 1/1995 | Shah | 365/185 |
| 5,386,132 A | * | 1/1995 | Wong | 257/316 |
| 5,460,988 A | * | 10/1995 | Hong | 437/43 |
| 5,510,730 A | * | 4/1996 | El Gamal et al. | 326/41 |
| 5,696,008 A | * | 12/1997 | Tamaki et al. | 437/40 |
| 5,874,760 A | * | 2/1999 | Burns, Jr. et al. | 257/315 |
| 5,909,618 A | | 6/1999 | Forbes et al. | |
| 5,936,274 A | * | 8/1999 | Forbes et al. | 257/315 |
| 5,973,352 A | * | 10/1999 | Noble | 257/315 |
| 5,973,356 A | | 10/1999 | Noble et al. | |
| 5,991,225 A | | 11/1999 | Forbes et al. | |
| 6,040,210 A | * | 3/2000 | Burns, Jr. et al. | 438/238 |
| 6,072,209 A | | 6/2000 | Noble et al. | |
| 6,104,061 A | * | 8/2000 | Forbes et al. | 257/330 |
| 6,124,729 A | | 9/2000 | Noble et al. | |
| 6,134,175 A | | 10/2000 | Forbes et al. | |
| 6,143,636 A | | 11/2000 | Forbes et al. | |
| 6,150,687 A | | 11/2000 | Noble et al. | |
| 6,153,468 A | | 11/2000 | Forbes et al. | |
| 6,208,164 B1 | | 3/2001 | Noble et al. | |
| 6,486,027 B1 | * | 11/2002 | Noble et al. | 438/259 |
| 6,580,124 B1 | * | 6/2003 | Cleeves et al. | 257/331 |
| 2002/0142546 A1 | * | 10/2002 | Kouznetsov et al. | 438/257 |
| 2002/0195649 A1 | * | 12/2002 | Noble et al. | 257/315 |

FOREIGN PATENT DOCUMENTS

| | | | | |
|---|---|---|---|---|
| EP | 0236676 | * | 1/1987 | G11C/17/00 |
| EP | 0498642 A1 | * | 5/1995 | G11C/16/02 |

* cited by examiner

Primary Examiner—Mary Wilczewski
Assistant Examiner—Monica Lewis
(74) Attorney, Agent, or Firm—Knobbe, Martens, Olson & Bear LLP

(57) ABSTRACT

Vertical body transistors with adjacent horizontal gate layers are used to form a memory array in a high density flash electrically erasable and programmable read only memory (EEPROM) or a logic array in a high density field programmable logic array (FPLA). The transistor is a field-effect transistor (FET) having an electrically isolated (floating) gate that controls electrical conduction between source regions and drain regions. If a particular floating gate is charged with stored electrons, then the transistor will not turn on and will provide an indication of the stored data at this location in the memory array within the EEPROM or will act as the absence of a transistor at this location in the logic array within the FPLA. The memory array or the logic array includes densely packed cells, each cell having a semiconductor pillar providing shared source and drain regions for two vertical body transistors that have control gates overlaying floating gates distributed on opposing sides of the semiconductor pillar. Both bulk semiconductor and silicon-on-insulator embodiments are provided. If a floating gate transistor is used to store a single bit of data or to represent a logic function, an area of only $2F^2$ is needed per respective bit of data or bit of logic, where F is the minimum lithographic feature size.

22 Claims, 22 Drawing Sheets

FLOATING GATE TRANSISTOR WITH HORIZONTAL GATE LAYERS STACKED NEXT TO VERTICAL BODY

BACKGROUND OF THE INVENTION

1. Field of the Invention

This invention relates generally to integrated circuits and in particular to floating gate transistors.

2. Description of the Related Art

Programmable memories and logic circuits are integral parts of a digital system, such as a computer, and can have similar physical structures. One type of programmable memories is an electrically erasable and programmable read only memory (EEPROM), which is a reprogrammable non-volatile memory that is widely used in the computer system for storing data both when power is supplied or removed. The typical data storage element of an EEPROM is a floating gate transistor, which is a field-effect transistor (FET) having an electrically isolated (i.e., floating) gate that controls electrical conduction between source and drain regions. Data is represented by charges stored on the floating gate and the resulting conductivity obtained between the source region and the drain region.

Recently, logic circuits based on programmable memories have been introduced. The logic circuits are implemented by field programmable logic arrays (FPLAs) which provide a flexible architecture via user-programmed on-chip fuses (i.e., switches) to perform specific functions for a given application. The FPLAs are fabricated with floating gate transistors similar to the programmable memories. However, the floating gate transistors in the FPLAs act as switches rather than as storage elements. A common problem among the programmable memories and the related FPLAs is a large cell size, which limits circuit density.

SUMMARY OF THE INVENTION

The present invention provides floating gate transistors with vertical bodies and horizontal gates stacked next to the corresponding vertical bodies. In one embodiment, the floating gate transistor includes a pillar of semiconductor material extending outwardly from a working surface of a substrate to form a source region, a body region and a drain region of the floating gate transistor. A floating gate is formed along one side of the pillar, and a control gate overlays the floating gate. In one embodiment, the pillar is formed by etching as part of the first steps in fabricating the floating gate transistor.

Electronic charges are selectively stored in the floating gate in programming the floating gate transistor. An absence or presence of stored charges on the floating gate determines a conductivity state of the transistor between the source region and the drain region. In one embodiment, hot electron injection is used to program the floating gate transistor. In an alternate embodiment, Fowler-Nordheim tunneling is used to program the floating gate transistor.

In one embodiment, floating gate transistors form an array. The array includes a plurality of semiconductor pillars arranged in rows and in columns. The pillars form respective bodies of the floating gate transistors. A plurality of floating gates forms in trenches between the columns of pillars, and the floating gates are separated from respective sides of the pillars by a gate dielectric. A plurality of control gates overlay the respective floating gates, and the control gates are separated from the respective floating gates by an intergate dielectric.

In one embodiment, the pillars are etched as part of an initial fabrication step to extend vertically from a substrate. For example, each body of the respective floating gate transistors extend outwardly from the substrate with a source region formed proximally to the substrate, a body region above the source region, and a drain region above the body region.

In one embodiment, two floating gates lie adjacent to each other in each trench between the columns of semiconductor pillars, and one control gate overlays the adjacent floating gates. In an alternate embodiment, one floating gate lie in each trench between the columns of semiconductor pillars, and one control gate overlays the floating gate. In another embodiment, two floating gates lie adjacent to each other in each trench between the columns of the semiconductor pillars, and two corresponding control gates lie adjacent to each other above the floating gates.

In one embodiment, an array of floating gate transistors is a memory cell array with the source regions of common rows electrically connected to be first input selection lines, the control gates electrically connected along the direction of the columns to be second input selection lines, and the drain regions of common columns electrically connected to be output data lines. In an alternate embodiment, an array of floating gate transistors is a logic array with the source regions of a common column electrically coupled to be selection lines during programming of the logic array, the control gates electrically coupled along the direction of the columns to be inputs to the logic array, and the drain regions of a common row electrically coupled to be output lines of the logic array. In another embodiment, an array of floating gate transistors is a field programmable logic array with the source regions of a common column electrically interconnected, the drain regions of a common row electrically interconnected, and the control gates interconnected along the direction of the columns.

Charges stored in the floating gates of a memory cell array represent data of the memory cell array. In one embodiment, hot electron injection is used to selectively place charges in the respective floating gates of the memory cell array, thereby writing data memory.

In one embodiment, a floating gate transistor is fabricated upon a substrate. The floating gate transistor includes a first conductivity type semiconductor pillar formed upon the substrate. The pillar has top and side surfaces. A first source/drain region of a second conductivity type forms in a portion of the pillar that is proximal to an interface between the pillar and the substrate. A second source/drain region of a second conductivity type forms in a portion of the pillar that is distal to the substrate and is separated from the first source/drain region. A gate dielectric forms on at least a portion of one side surface of the pillar. A floating gate forms substantially adjacent to a portion of the side surface of the pillar and is separated therefrom by the gate dielectric. An intergate dielectric forms on a top surface of the floating gate. A control gate substantially overlays the floating gate and is insulated therefrom by the intergate dielectric.

Electrical charges in the floating gate controls electrical conduction between the first source/drain region and the second source/drain region of the floating gate transistor. In one embodiment, the floating gate transistor is a data storage element in a programmable memory array with the data represented by charges stored in the respective floating gates.

In one embodiment, fabrication of the floating gate transistors includes using a sacrificial gate layer to define a gate length. The sacrificial gate layer is selectively removed and replaced with a floating gate in a subsequent step. In one embodiment, the sacrificial gate layer is undoped oxide, and the floating gate is doped polysilicon.

In one embodiment, dopant layers are on top and bottom respectively of a sacrificial gate layer. The dopant layers and the sacrificial gate layer form in a trench defined by pillars of semiconductor material which form source, body and drain regions of transistors. In one embodiment, the sacrificial gate layer substantially aligns with the body region in the horizontal direction. The bottom dopant layer substantially aligns with an interface between the source and body regions, overlapping both regions in the horizontal direction. The top dopant layer substantially aligns with an interface between the drain and body regions, overlapping both regions in the horizontal direction.

In one embodiment of a fabrication process, heat treatment is used to form self-aligned transistor structures. For example, diffusion of the dopant layers during the heat treatment results in lightly doped source/drain regions in the body region. The lightly doped source/drain regions act as extensions of the source and drain regions respectively. The separation distance between the lightly doped source/drain regions is partially controlled by the thickness of the sacrificial gate layer. When the floating gate replaces the sacrificial gate layer, minimal gate overlaps occur with the lightly doped source/drain regions.

DETAILED DESCRIPTION OF EMBODIMENTS OF THE INVENTION

Figure 1:
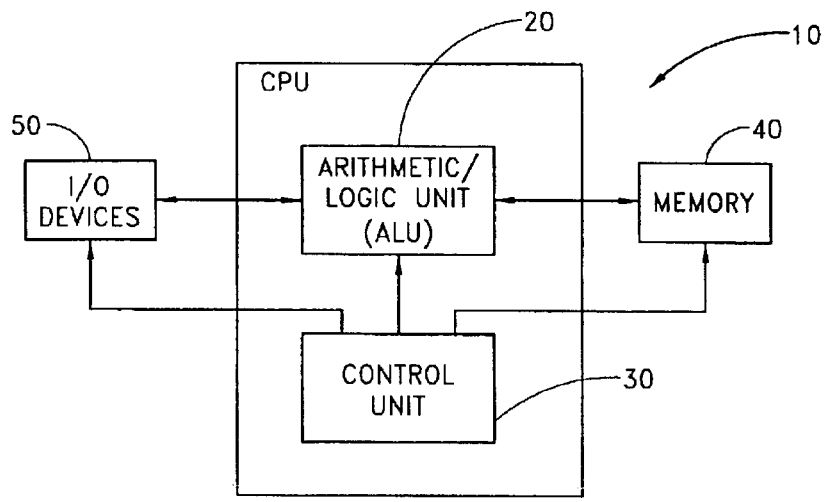
FIG. 1 is a block diagram of a high-level organization of a computer.

In the following detailed description of the invention, reference is made to the accompanying drawings which form a part thereof, and in which is shown, by way of illustration, specific embodiments in which the invention may be practiced. In the drawings, like numerals describe substantially similar components throughout the several views.

In the following description, the terms wafer and substrate are interchangeably used to refer generally to any structure on which integrated circuits (ICs) are formed, and also to such structures during various stages of integrated circuit fabrication. Both wafer and substrate include doped and undoped semiconductors, epitaxial semiconductor layers supported by a base semiconductor or insulator, combinations of such layers, as well as other semiconductor structures well known to one skilled in the art, including bulk semiconductor and semiconductor-on-insulator (SOI) substrates. The term conductor is understood to include semiconductors, and the term insulator is defined to include any material that is less electrically conductive than the materials referred to as conductors.

FIG. 1 is a block diagram of a high-level organization of a computer 10. A computer 10 is a system whose functional elements include an arithmetic/logic unit (ALU) 20, a control unit 30, a memory unit 40 and input/output (I/O) devices 50. The ALU 20 and the control unit 30 are parts of a central processing unit (CPU). The control unit 30 controls the operations of the ALU 20, the I/O devices 50 and the memory unit 40. The ALU 20 interacts with the I/O devices 50 and the memory unit 40.

The memory unit 40 contains data plus a stored list of instructions, which can be retrieved and executed by the ALU 20. The data and instructions can be stored using nonvolatile high density electrically erasable and programmable read only memories (EEPROMs) that allow simultaneous erasure of multiple data bits, referred to as flash EEPROMs.

Figure 2:
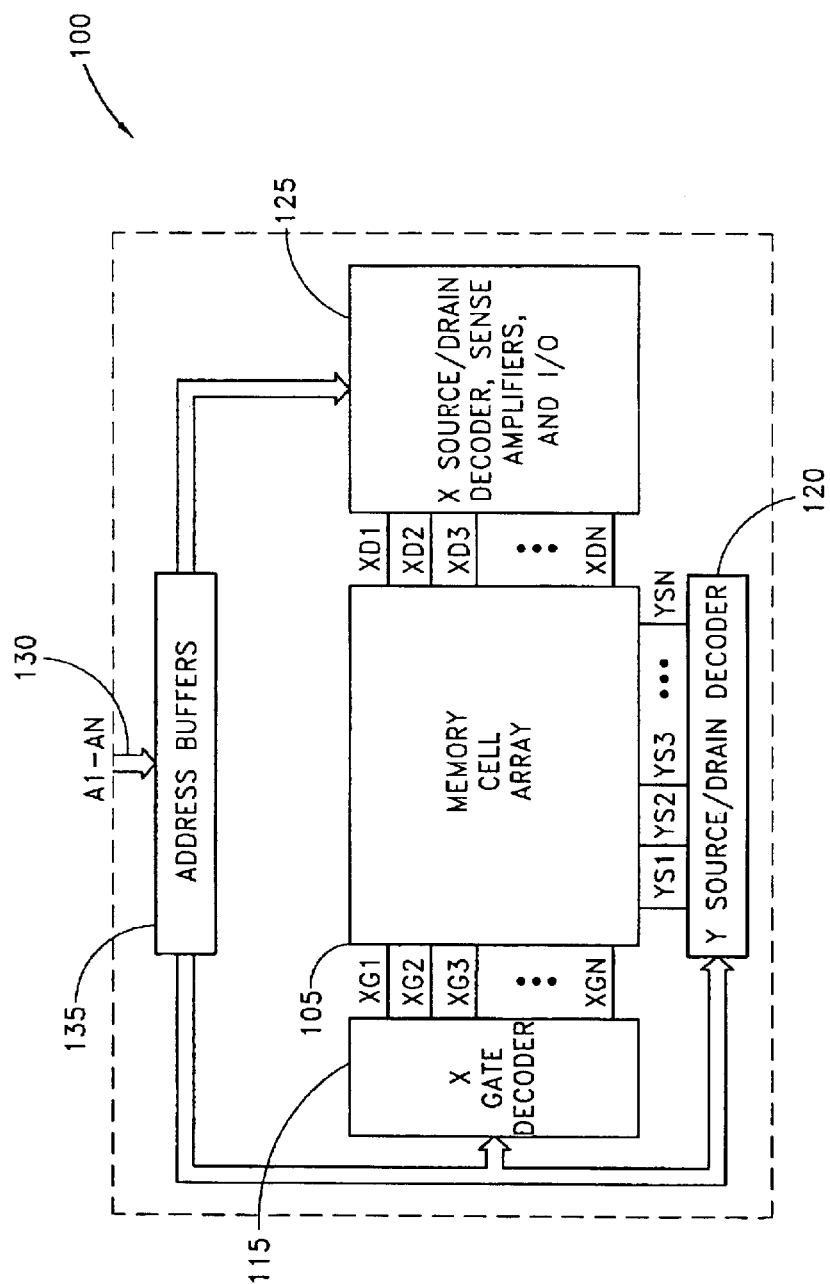
FIG. 2 is a block diagram illustrating one embodiment of a nonvolatile memory, including an array having a plurality of memory cells.

FIG. 2 is a block diagram illustrating one embodiment of a nonvolatile memory 100, including a memory cell array 105 having a plurality of memory cells. In the embodiment of FIG. 2, the nonvolatile memory 100 is a flash EEPROM. However, the invention can be applied to other semiconductor devices, such as static or dynamic random access memories (SRAMs or DRAMs, respectively), synchronous random access memories or other types of memories that include a matrix of selectively addressable memory cells.

The nonvolatile memory 100 includes the memory cell array 105, having cells therein that include floating gate transistors, as described below. An X gate decoder 115 provides a plurality of gate lines, XG1, XG2 . . . XGN for addressing the floating gate transistors in the memory cell array 105, as described below. A Y source/drain decoder 120 provides a plurality of first source/drain interconnection lines YS1, YS2 . . . YSN, for accessing first source/drain regions of the floating gate transistors in the memory cell array 105, as described below. In an embodiment in which commonly connected first source/drain interconnection lines YS1, YS2 . . . YSN are used, the Y source/drain decoder 120 may be omitted. An X source/drain decoder 125 provides a plurality of data lines, XD1, XD2 . . . XDN for accessing second source/drain regions of the floating gate transistors in the memory cell array 105, as described below. The X source/drain decoder 125 also includes sense amplifiers and I/O circuitry for reading, writing, and erasing data to and from the memory cell array 105.

In response to address signals A1–AN that are provided on address lines 130 during read, write, and erase operations, address buffers 135 control the operations of the X gate decoder 115, the Y source/drain decoder 120, and the X source/drain decoder 125. The address signals A1–AN are provided by a controller such as the control unit 30 that is fabricated separately or together with the memory 100, or otherwise provided by other suitable circuits. As described in detail below, the address signals A1–AN are decided by the X gate decoder 115, the Y source/drain decoder 120, and the X source/drain decoder 125 to perform the reading, the writing, and the erasing operations on cells that include a number of floating gate field-effect transistors (FETs) formed on the sides of a semiconductor pillar on a substrate.

Figure 3:
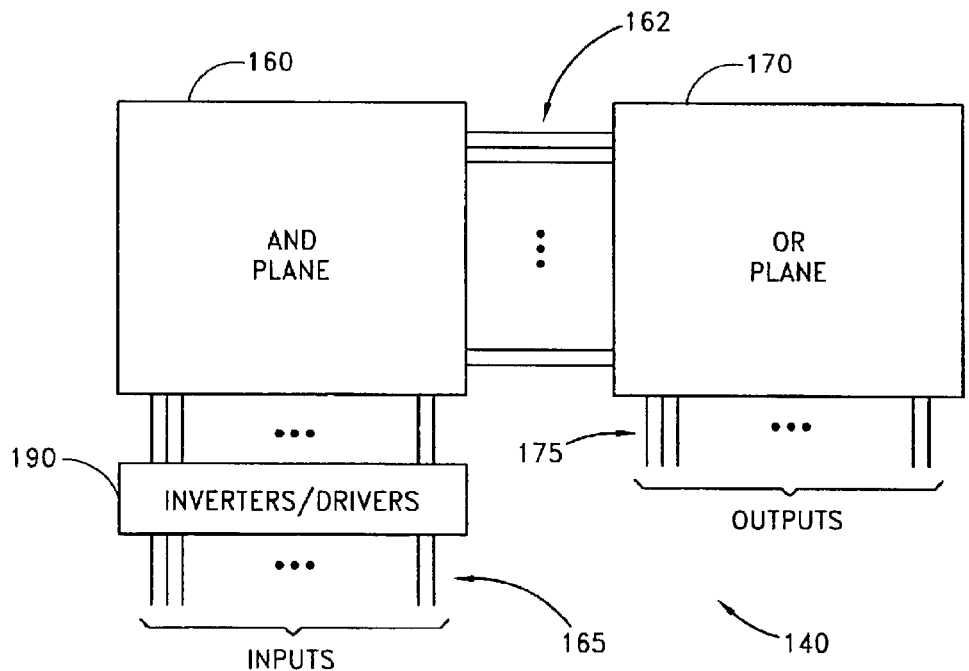
FIG. 3 is a block diagram of a field programmable logic array.

FIG. 3 is a block diagram of a field programmable logic array (FPLA) 140. The FPLA 140 can be implemented to perform many of the logic functions performed by the ALU 20, the control unit 30 and the I/O devices 50 as well as the X gate decoder 115, the Y source/drain decoder 120 and the X source/drain decoder 125. The decoders 115, 120, 125 can be easily reprogrammed when implemented with FPLA-like structures, thereby facilitating the addition of redundant circuit elements in the memory cell arrays 105 to improve yield.

FPLAs are commercially available standard chips that are programmed to perform desired logic combinations. FPLAs provide varying numbers of inputs and outputs and product terms, depending on the particular logic function chosen. Arbitrary logic functions may be realized in the "sum-of-products" form that is well known to one skilled in the art. A logic function sum-of-products may be implemented using any of the equivalent two-level logic configurations: AND-OR, NAND-NAND, NOR-OR, OR-NOR, AND-NOR, NAND-AND or OR-AND.

In the embodiment of FIG. 3, the two major constituents are an AND plane 160 and an OR plane 170. Inputs on input lines 165 are supplied to a set of inverters and drivers 190 coupled to the AND plane 160. The set of inverters and drivers 190 supply true and complemented values of the inputs to the AND plane 160. The AND plane 160 computes conjunctions of relevant combinations of inputs and their complements. The conjunctions and their complements are provided to the OR plane 170 via interconnection lines 162. The OR plane 170 computes disjunctions of terms applied from the AND plane 160. The disjunctions are provided as outputs on output lines 175.

In addition, various control circuits and signals not detailed herein initiate and synchronize operations of the FPLA 140 as known to those skilled in the art. The description of the FPLA 140 has been simplified for purposes of illustrating the present invention and is not intended to be a complete description of all the features of a FPLA. The FPLA 140 described herein is illustrative only and is not intended to be exclusive or limiting.

Figure 4:
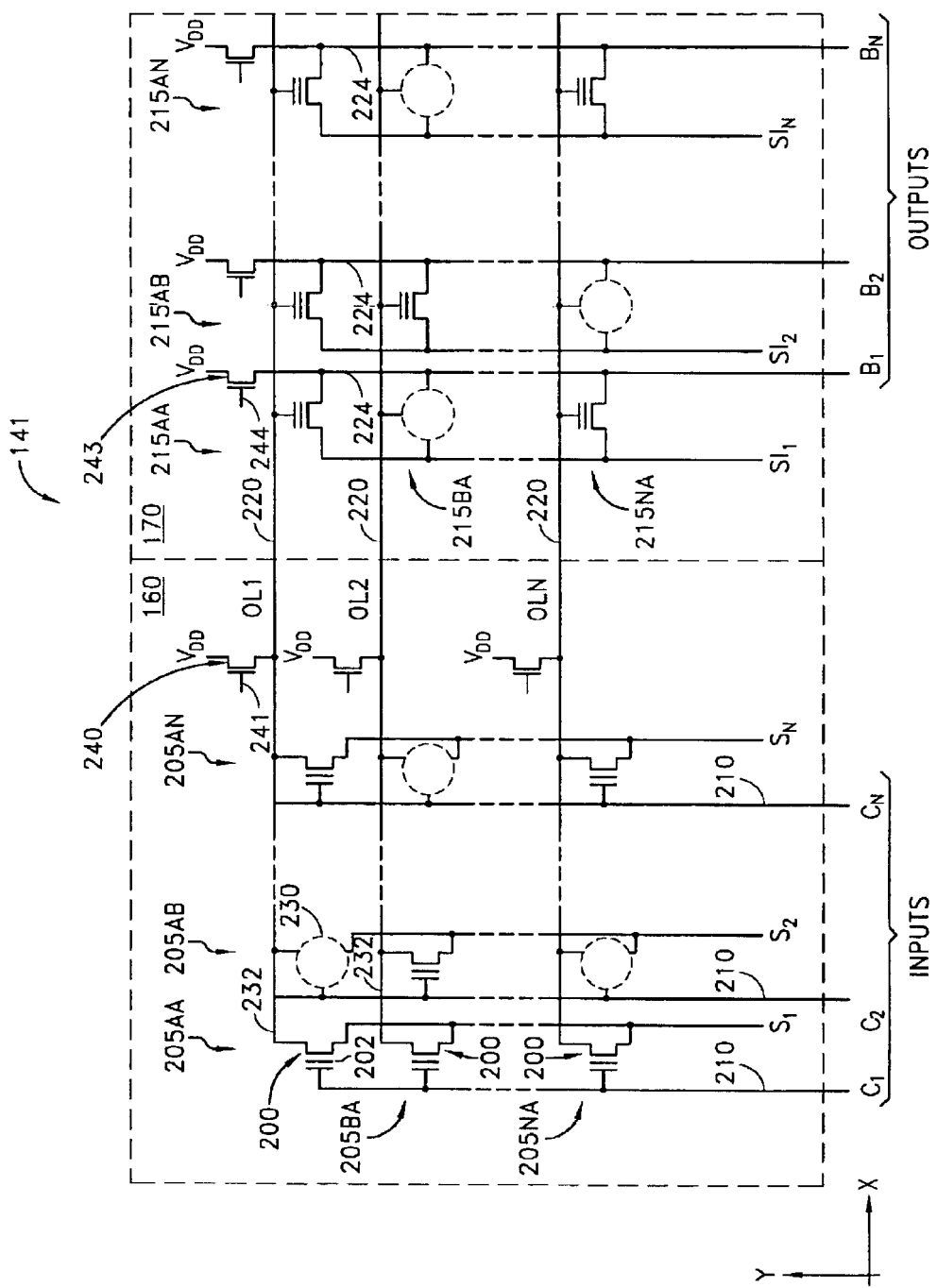
FIG. 4 is a schematic diagram illustrating one embodiment of a field programmable logic array.

FIG. 4 is a schematic diagram illustrating one embodiment of a FPLA 141. It is well known to one skilled in the art that the FPLA 141 is essentially a systematic way to implement a sum-of-products form of one or more logical functions of a set of input variables. An arbitrary combination logic function can be realized using the sum-of-products form. For example, a sum-of-products may be implemented by using a two level logic configuration such as programmable NOR-NOR arrays 160, 170 shown in FIG. 4. Each of the arrays 160, 170 is implemented with transistors 200 having floating gates 202.

The FPLA 141 is made up of logic cells 205, 215. For the first array 160, the transistors 200 are arranged in cells 205AA, 205BA . . . 205NA in a first dimension, e.g., in a Y-dimension of first array input lines C1–CN, and in cells 205AA, 205AB . . . 205AN in a second dimension, e.g., in an X-dimension of first array output lines OL1–OLN. Each of the logic cells 205 thus includes a transistor 200 having a floating gate 202 and one of the first array input lines C1–CN for receiving input signals. The first array input lines C1–CN are also referred to as first control lines 210.

In a similar manner, the second array 170 includes transistors 200 arranged in cells 215AA, 215AB . . . 215AN in a first dimension, e.g., in the X-dimension of the second array input lines OL1–OLN, and in cells 215AA, 215BA . . . 215NA in a second dimension, e.g., in the Y-dimension of second array output lines B1–BN 224. Each of the logic cells 215 thus includes a transistor 200 having a floating gate 202 and one of the first array output lines OL1–OLN. The first array output lines OL1–OLN serve as the second array input lines OL1–OLN. The second array input lines OL1–OLN are also referred to as second control lines 220. Because of the substantially identical nature of logic cells 205 and 215, only logic cells 205 are discussed in detail in the following paragraphs.

The transistors 200 are floating gate transistors, which are FETs having electrically isolated (i.e., floating) gates 202 that control electrical conduction between the sources S1–SN and drains 232. The drains 232 are interconnected with the first array output lines OL1–OLN. The sources S1–SN share a common ground for operation of the FPLA 141 in one embodiment.

As an alternative embodiment, the sources S1–SN do not share the common ground. The sources S1–SN are isolated from a substrate. Separation of the sources S1–SN from each other allows the FPLA 141 to be field programmed, or erased and reprogrammed, to accomplish the required logic functions.

The FPLA 141 has first array input lines C1–CN and second array output lines B1–BN. An N-input FPLA reaches a limiting case when it has $2^N$ product terms. In the limiting case, the FPLA 141 is equivalent to a read only memory (ROM) with N address bits, and the first array 160 would be identified as a ROM address decoder. However, the FPLA 141 finds most effective use as a replacement for logic gates when the number of product terms is much smaller than $2^N$. Such a requirement is often found in the control unit 30 of the computer 10, as illustrated in FIG. 1. For example, a 32-bit very large scale integration (VLSI) computer instruction decoding unit uses a FPLA of 26 inputs, 206 product terms and 22 outputs for decoding instruction operation codes. A ROM with 26 input bits would have more than 67 million addresses, compared to only 206 product terms used in this example.

Programmability of the transistors 200 is achieved by charging the floating gates 202. When the floating gates 202 are charged, the respective transistors 200 remain in an off state until it is reprogrammed. Applying and removing charges to the floating gates 202 is discussed in more detail within the following paragraphs. The transistors 200 in an off state are represented by dotted circles 230 instead of actually displaying the full transistors. The transistors 200 programmed in an off state remains in that state until the charges are removed from the floating gates 202.

The transistors 200 not having corresponding floating gates 202 charged are fully illustrated in FIG. 4. These transistors 200 operate in either an on state or an off state, wherein the input signals received by the first array input lines C1–CN determine the applicable states. Each of the transistors 200 has a source and drain fabricated using a semiconductor pillar on a substrate. In one embodiment, the sources S1–SN are connected to the common ground for all the transistors 200, and the drains 232 are the first array output lines OL1–OLN.

If any of the transistors 200 is turned on, then a ground is provided to the source of a first pull up transistor 240. The source of each of the first pull up transistor 240 is connected to a respective first array output line OL1–OLN. Therefore, a low voltage level is provided on the first array output line OL1–OLN when any one of the associated transistors 200 is activated. A high voltage level is provided on the first array output line when the associated transistors 200 are off, and the corresponding first pull up transistor 240 is turned on by a clock signal applied to a first pull up input 241, e.g., a gate of the first pull up transistor 240.

In a similar fashion, if the transistors 200 in the second array 170 are turned on via the first array output lines OL1–OLN, then a ground is provided to the source of a second pull up transistor 243. The source of each of the second pull up transistor 243 is connected to the respective second array output line B1–BN. Therefore, a low voltage level is provided on the second array output line B1–BN when any one of the associated transistors 200 is activated. A high voltage level is provided on the second array output line B1–BN when the associated transistors 200 are off, and the corresponding second pull up transistor 243 is turned on by a clock signal applied to a second pull up input 244, e.g., a gate of the second pull up transistor 243.

Figure 5:
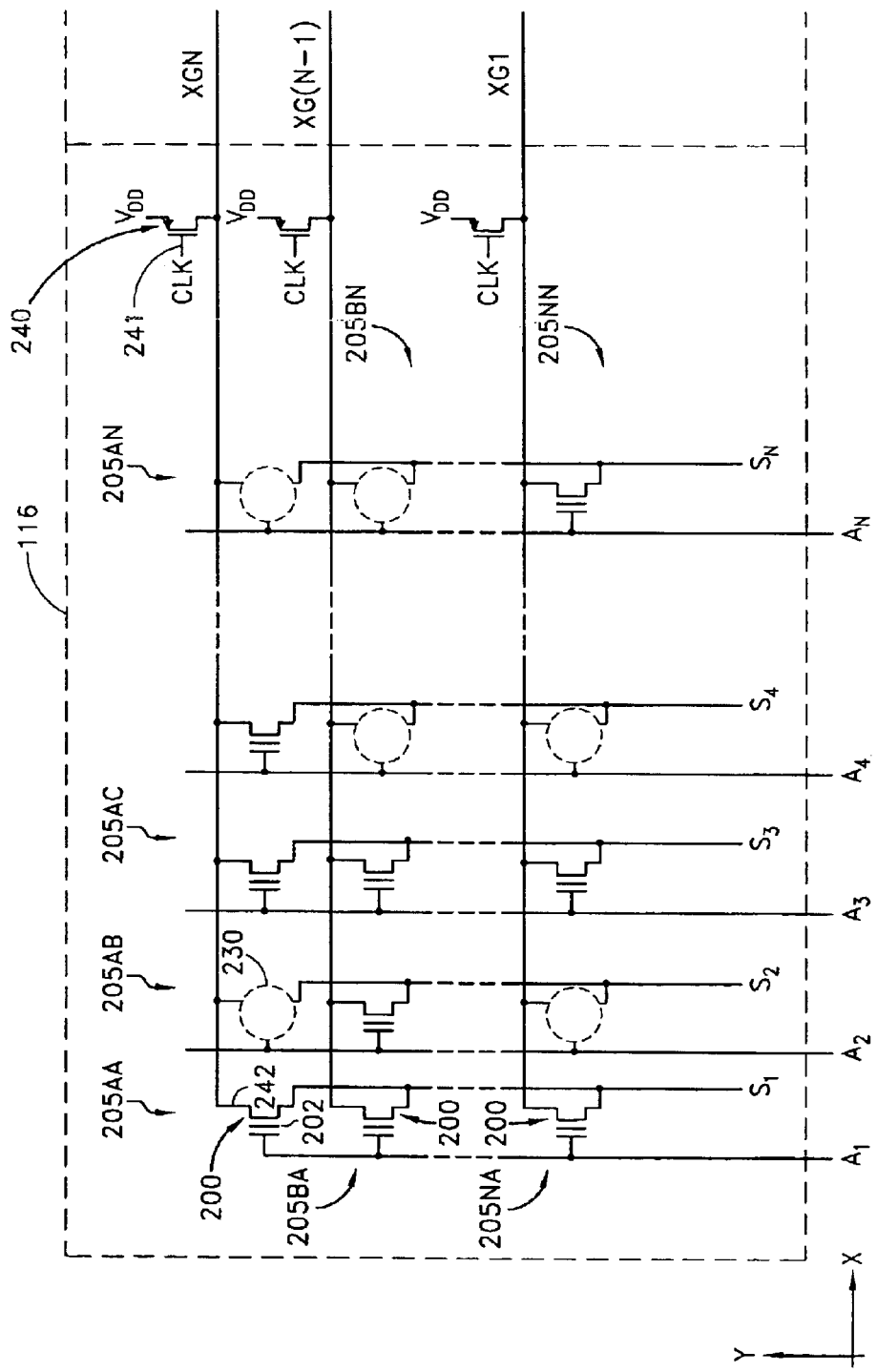
FIG. 5 is a schematic diagram illustrating one embodiment of a programmable decoder array.

FIG. 5 is a schematic diagram illustrating one embodiment of a programmable decoder array 116, e.g., the X gate decoder 115. The architecture of the other programmable decoders 120, 125 is substantially similar and is not discussed in detail. The programmable decoder array 116 of FIG. 5 is implemented with a plurality of transistors 200, each having a corresponding floating gate 202. The floating gates 202 control electrical conduction between the sources S1–SN and drains 242.

In one embodiment, the programmable decoder array 116 is programmed at memory test to select functional wordlines within the memory cell array 105. The programmable decoder array 116 serves as an illustrative embodiment of a programmable memory address decoder using a NOR decoding scheme implemented with the transistors 200 described herein. Other decoding schemes are acceptable, such as AND, OR, and NAND, etc.

Because of the substantially identical nature of the programmable decoder array 116 and the first array 160 of the FPLA 141, the characteristics of the first array 160 discussed above applies equally to the programmable decoder array 116. Furthermore, only the first array 160 is discussed in detail in the paragraphs below with the understanding that the discussion is equally applicable to the programmable decoder array 116. One skilled in the art will readily recognize and understand the change in the labeling of the input and output lines.

Figure 6:
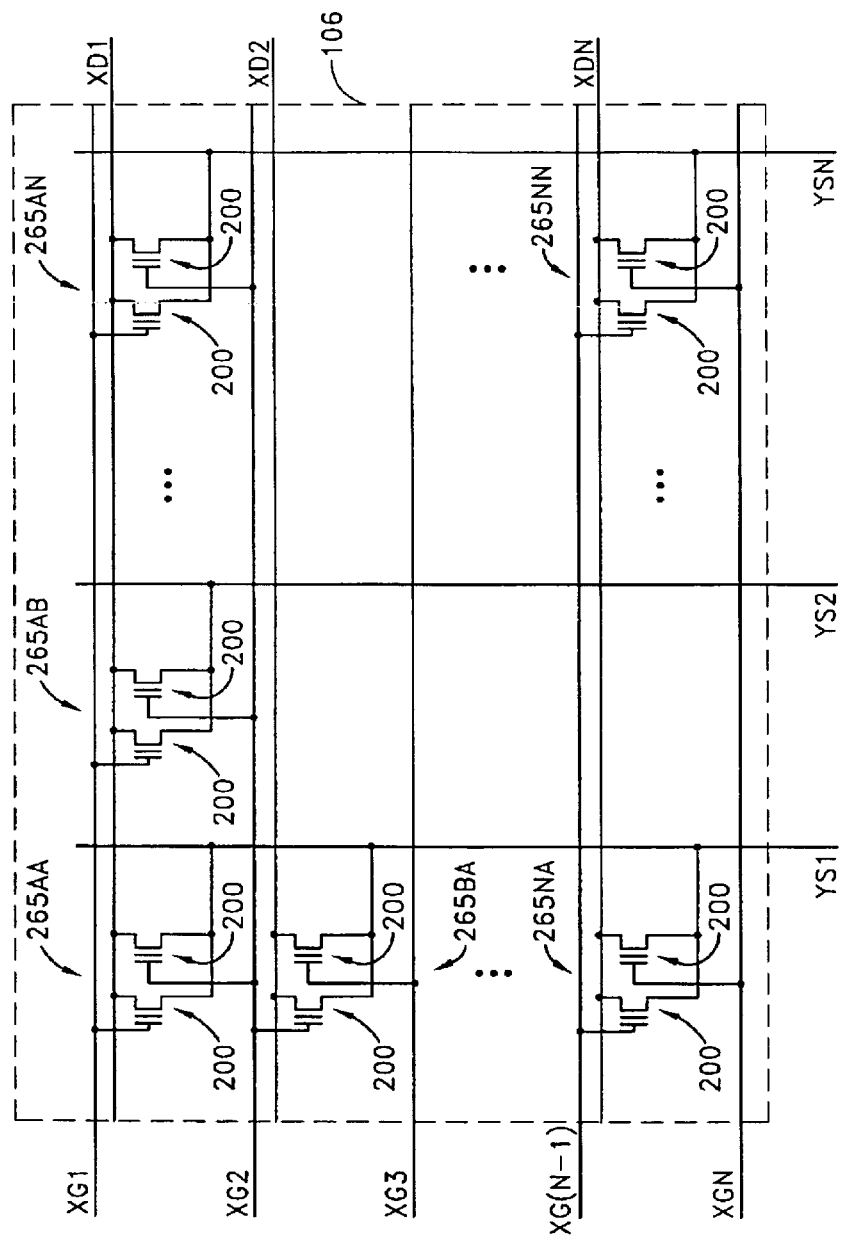
FIG. 6 is a schematic diagram illustrating one embodiment of an array of memory cells.

FIG. 6 is a schematic diagram illustrating one embodiment of an array 106 of memory cells, e.g., the memory cell array 105. In FIG. 6, each memory cell 265 includes two floating gate transistors 200. The floating gate transistors 200 are arranged in cells 265AA, 265BA . . . 265NA in a first dimension, e.g, in the Y-dimension of the first source/drain interconnection lines YS1, YS2 . . . YSN, and in cells 265AA, 265AB . . . 265AN in a second dimension, e.g., in the X-dimension of the data lines, XD1, XD2 . . . XDN.

In the embodiment of FIG. 6, each cell 265 includes two floating gate transistors 200 that share a common first source/drain region, such as a source region coupled to one of the first source/drain interconnection lines YS1, YS2 . . . YSN. The floating gate transistors 200 of each cell 265 also share a common second source/drain region, such as a drain region coupled to one of the data lines, XD1, XD2 . . . XDN. The first and the second source/drain regions are fabricated using a common semiconductor pillar on a substrate, as explained below.

Figure 7A:
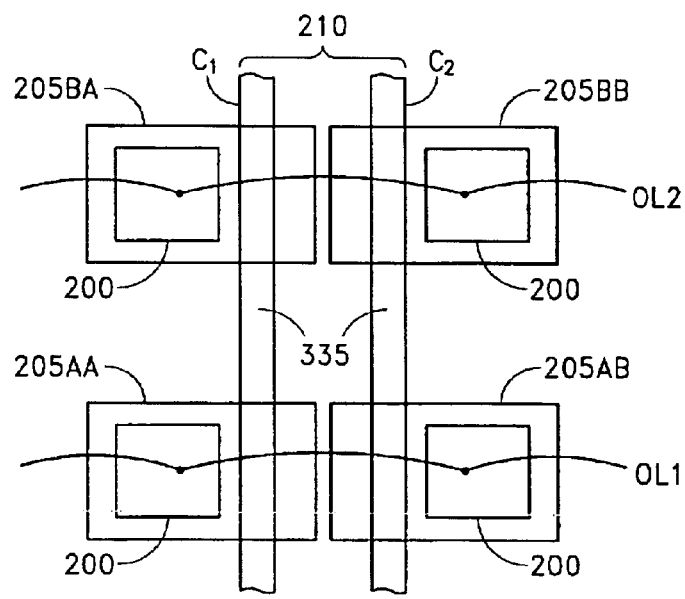
FIG. 7A illustrates a top view of a portion of an array having split control gates.
Figure 7B:
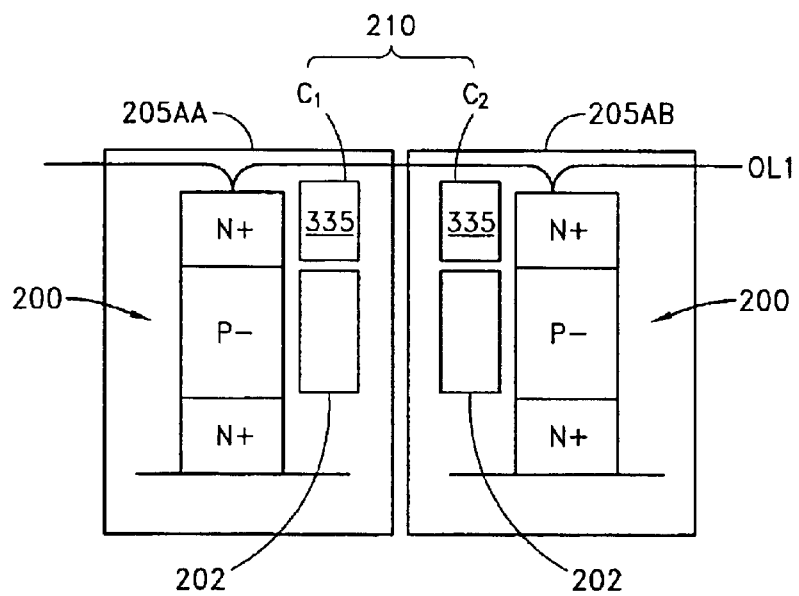
FIG. 7B illustrates a front view of a portion of an array having split control gates.

FIGS. 7A and 7B illustrated a top view and a front view, respectively, of a portion of an array having split control gates, i.e. two adjacent control gates 335. In the embodiment shown in FIGS. 7A and 7B, the two control gates 335 overlaying corresponding floating gates 202 are next to each other, as illustrated by logic cells 205AA, 205AB, 205BA and 205BB. FIG. 7A illustrates, by way of example, the output lines OL1 and OL2, which are shown schematically for clarity. In one embodiment, the control gates 335 are coupled to the control lines C1–CN 210 of the FPLA 141. One advantage of the split control gates 335 is that only one transistor 200 is required per logic cell 205. Each of the transistors 200 can be individually selected when the split control gates 335 are isolated from each other.

Figure 8A:
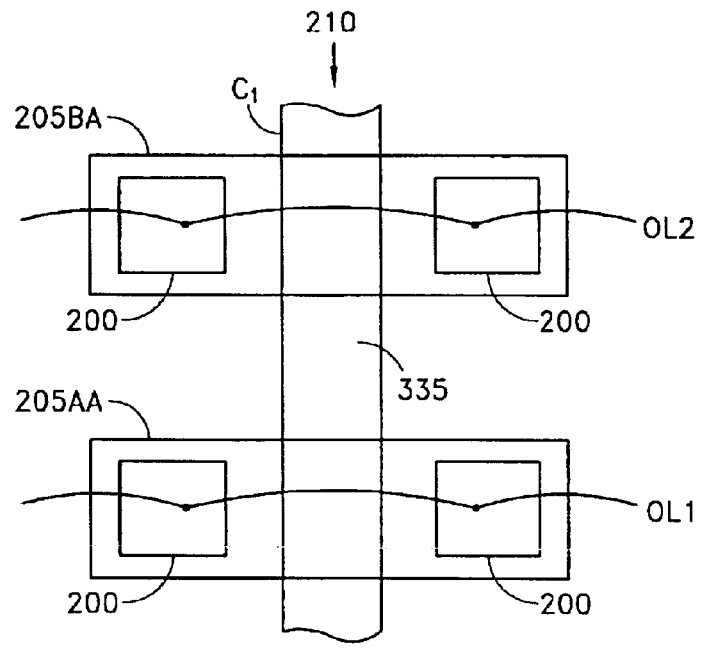
FIG. 8A illustrates a top view of a portion of an array having a single control gate.
Figure 8B:
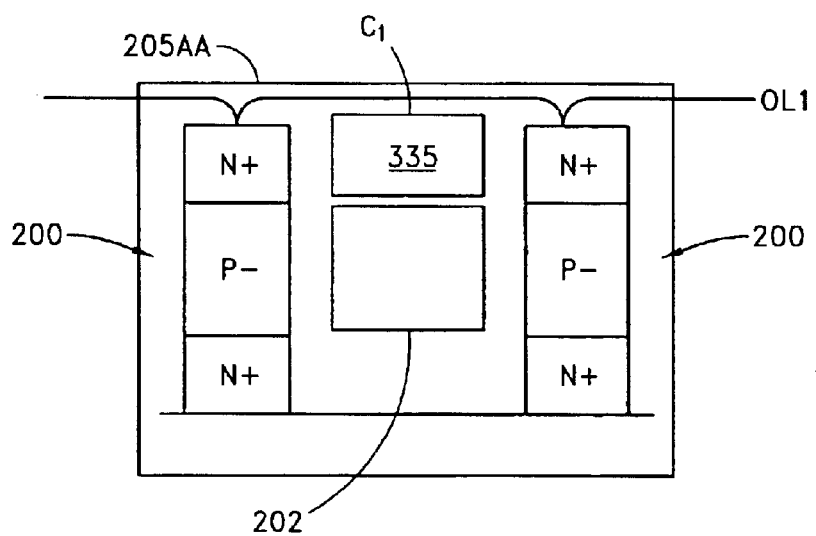
FIG. 8B illustrates a front view of a portion of an array having a single control gate.

FIGS. 8A and 8B illustrate a top view and a front view, respectively, of a portion of an array having a single control gate 335. In the embodiment shown in FIGS. 8A and 8B, the single control gate 335 overlaying corresponding floating gates 202 is in the middle of logic cells 205AA and 205BA. When the single control gate 335 is high, the transistors 200 on both sides of the control gate 335 are activated. In one embodiment, the control gate 335 is coupled to one of the control lines C1–CN 210 of the FPLA 141. One advantage of the single control gate 335 is redundancy in the selection of an output, but one drawback is the loss of circuit density because of the duplication.

Figure 9A:
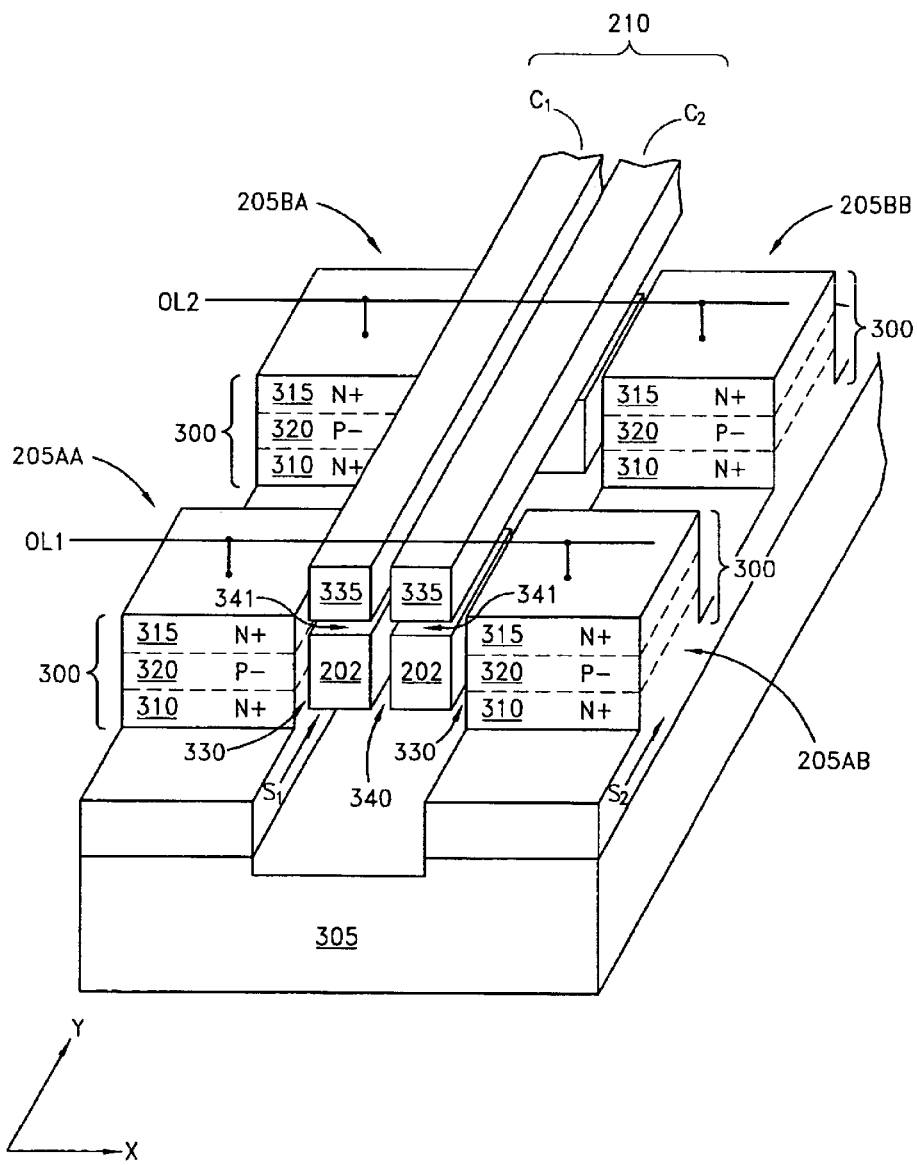
FIG. 9A is a perspective view of one embodiment of vertical transistors with horizontal gate layers, illustrated by a portion of an array having split control gates.

FIG. 9A is a perspective view of one embodiment of vertical transistors 200 with horizontal gate layers 202, 335, illustrated by a portion of an array having split control gates 335. For example, the embodiment of FIG. 9A is a portion of the completed FPLA 141, including four transistors 200 having split control gates 335, as illustrated in FIGS. 7A and 7B.

In FIG. 9A, the substantially identical transistors 200 of the completed FPLA 141 are illustrated by way of example through logic cells 205AA, 205AB, 205BA and 205BB. Each logic cell 205 includes a semiconductor pillar 300, initially of a first conductivity type such as P− silicon, fabricated upon a monolithic substrate 305. In one embodiment, the substrate 305 is a bulk semiconductor, such as P− silicon. In another embodiment, the substrate 305 is a semiconductor-on-insulator (SOI) substrate including an insulating layer, such as silicon dioxide ($SiO_2$), as described below.

The pillar 300 provides a source region 310, a drain region 315, and a body region 320 for the floating gate transistor 200 of a particular logic cell, e.g., 205AA. The source region 310 is formed proximally to a sub-micron dimensional interface between the pillar 300 and the substrate 305 from a second conductivity type, such as N+ silicon. The drain region 315 is formed distal to the substrate 305 from the second conductivity type, such as N+ silicon, and separated from the source region 310 by the body region 320 formed from the first conductivity type, such as P− silicon.

First source interconnection lines S1–SN electrically interconnect the source regions 310 of pillars 300 in the Y-dimension. In one embodiment, the first source interconnection lines S1–SN comprise a conductively doped semiconductor of the second conductivity type, such as N+ silicon, disposed at least partially within the substrate 305. For example, dopants can be ion-implanted or diffused into the substrate 305 to form the first source interconnection lines S1–SN.

In another embodiment, the first source interconnection lines S1–SN are formed above the substrate 305. For example, a doped epitaxial semiconductor layer can be grown on the substrate 305, from which the first source interconnection lines S1–SN are formed. Alternatively, an undoped epitaxial semiconductor layer can be grown on the substrate 305, and dopants then introduced by ion-implantation or diffusion to obtain the first source interconnection lines S1–SN of the desired conductivity.

The drain regions 315 of the pillars 300 are interconnect by output lines OL1–OLN in the X-dimension. FIG. 9A illustrates, by way of example, the output lines OL1 and OL2, which are shown schematically for clarity. However, it is understood that the output lines OL1–OLN comprise metal or other interconnection lines that are isolated from the underlying topology, e.g., the pillars 300, by an insulating layer through which contact holes are etched to access the drain regions 315 of the pillars 300.

The pillar 300 is outwardly formed from the substrate 305, and is illustrated in FIG. 9A as extending vertically upward from the substrate 305. The pillar 300 has a top region that is separated from the substrate 305 by four surrounding side regions. Floating gates 202 are formed substantially adjacent to two opposing side surfaces of the pillar 300 and separated therefrom by a gate dielectric 330, such that there are two floating gates 200 per pillar, though FIG. 9A omits some of the floating gates 202 for clarity of illustration.

Each of the floating gates 202 has a corresponding substantially overlying control gate 335 from which it is separated by an intergate dielectric 341. Except at the periphery, there are two floating gates 202 with the corresponding overlying control gates 335 interposed between two approximately adjacent pillars 300. For example, in FIG. 9A, control gates 335 coupled to respective control lines C1 and C2 are interposed between the logic cells 205AA, 205BA on one side and the logic cells 205AB, 205BB on the other side. The control line C1 controls the logic cells 205AA, 205BA while the control line C2 controls the logic cells 205AB, 205BB. The adjacent control gates 335 and their corresponding underlying floating gates 202 are separated by an intergate dielectric 340 wherein the portion of the control gate over lapping the floating gate dose not overlap the body region in either the horizontal or a vertical direction.

In this embodiment, the control gates 335 are coupled to control lines running in the Y-dimension, e.g., perpendicular to the output lines OL1–OLN. Each of the control lines C1–CN interconnects a plurality of transistors in the Y-dimension. For example, the control line C1 electrically interconnects the control gates 335 of the logic cells 205AA–205NA. The split control gates 335 allow the underlying floating gates 202 to be independent between pairs of logic cells, 205AA and 205AB, 205BA and 205BB . . . 205NA and 205BN. In the embodiment of FIG. 9A, the control lines are disposed above the floating gates 202, as described below.

In one embodiment, hot electron injection is used to program the floating gate transistors 200. For example, a voltage of approximately zero volt is provided through one of the source interconnection lines S1–SN to the source region 310 of a particular floating gate transistor 200. A voltage of approximately 5 volts is provided through one of the output lines OL1–OLN to the drain region 315 of the particular floating gate transistor 200. A voltage of approximately 10 volts is provided through one of the control lines C1–CN to the control gate 335 of the particular floating gate transistor 200. A resulting inversion region, i.e., channel, is formed in the body region 320 of the particular floating gate transistor 200. Hot electrons generated in the channel are injected through the gate dielectric 330 and onto the adjacent floating gate 202 beneath the control gate 335.

The exact value of the voltages provided to the drain regions 315 and the control gates 335 depend on the physical dimension of the floating gate transistors 200, including the thickness of the gate dielectric 330, the thickness of the intergate dielectric 341, and the separation distance between the source region 310 and the drain region 315. Alternatively, the floating gate transistors 200 can be programmed by Fowler-Nordheim tunneling by providing higher voltages to the control gates 335 and a thinner gate dielectric 330 and a thinner intergate dielectric 341. Electrons are tunneled from the body region 320, the source region 310 and the drain region 315 to the floating gate 202.

The absence or presence of stored charge on the floating gate 202 of a particular floating gate transistor 200 is determined by the conductivity state of the floating gate transistor 200 between its source region 310 and drain region 315. The conductivity state is detected by addressing one of the control lines C1–CN and one of the source interconnection lines S1–SN to form a coincidence at the particular floating gate transistor 200. For example, a voltage of approximately zero volt is provided through one of the source interconnection lines S1–SN to the source region 310 of the particular floating gate transistor 200. A positive voltage of approximately three to five volts is provided through one of the control lines C1–CN to the control gate 335 of the particular floating gate transistor 200. One of the output lines OL1–OLN that is coupled to the drain region 315 of the particular floating gate transistor 200 is precharged to a positive voltage by a pull up transistor 240.

If there are no electrons stored on the floating gate 202, the floating gate transistor 200 conducts between its source region 310 and drain region 315, decreasing the voltage of the corresponding output line toward the voltage of the source region 310, e.g., toward a "low" binary logic level voltage of approximately zero volt. If there are electrons stored on the floating gate 202, the floating gate transistor 200 does not conduct between it source region 310 and drain region 315. As a result, the pull up transistor 240 tend to increase the voltage of the corresponding output line toward a positive voltage, e.g., toward a "high" binary logic voltage level.

In the manner described above, the floating gate transistors 200 can be programmed. The programming can also be reversed, e.g., erased. In one embodiment, erasure includes providing an erasure voltage difference between 10 and 12 volts from the source region 310 to the corresponding control gate 335. For example, a negative voltage is provided to the control gate 335 while a positive bias is provided to the source region 310 to yield the erasure voltage. Alternately, zero volt is provided to the source region 310 while a negative voltage is provided to the control gate 335 to yield the erasure voltage. The exact value of the erasure voltage varies depending upon the physical dimensions of the floating gate transistor 200, such as the thickness of the gate dielectric 330 and the thickness of the intergate dielectric 341. Electrons are removed from the corresponding floating gate 202 by Fowler-Nordheim tunneling as a result of the erasure voltage.

In one embodiment, an entire row of floating gate transistors 200 is simultaneously erased by applying approximately between −10 to −12 volts to one of the control lines C1–CN and also applying zero volt to one of the source interconnection lines S1–SN. In another embodiment, one or more rows of floating gate transistors 200 are simultaneously erased by applying approximately between −10 to −12 volts to one or more control lines C1–CN and also applying zero volt to one or more source interconnection lines S1–SN.

Figure 9B:
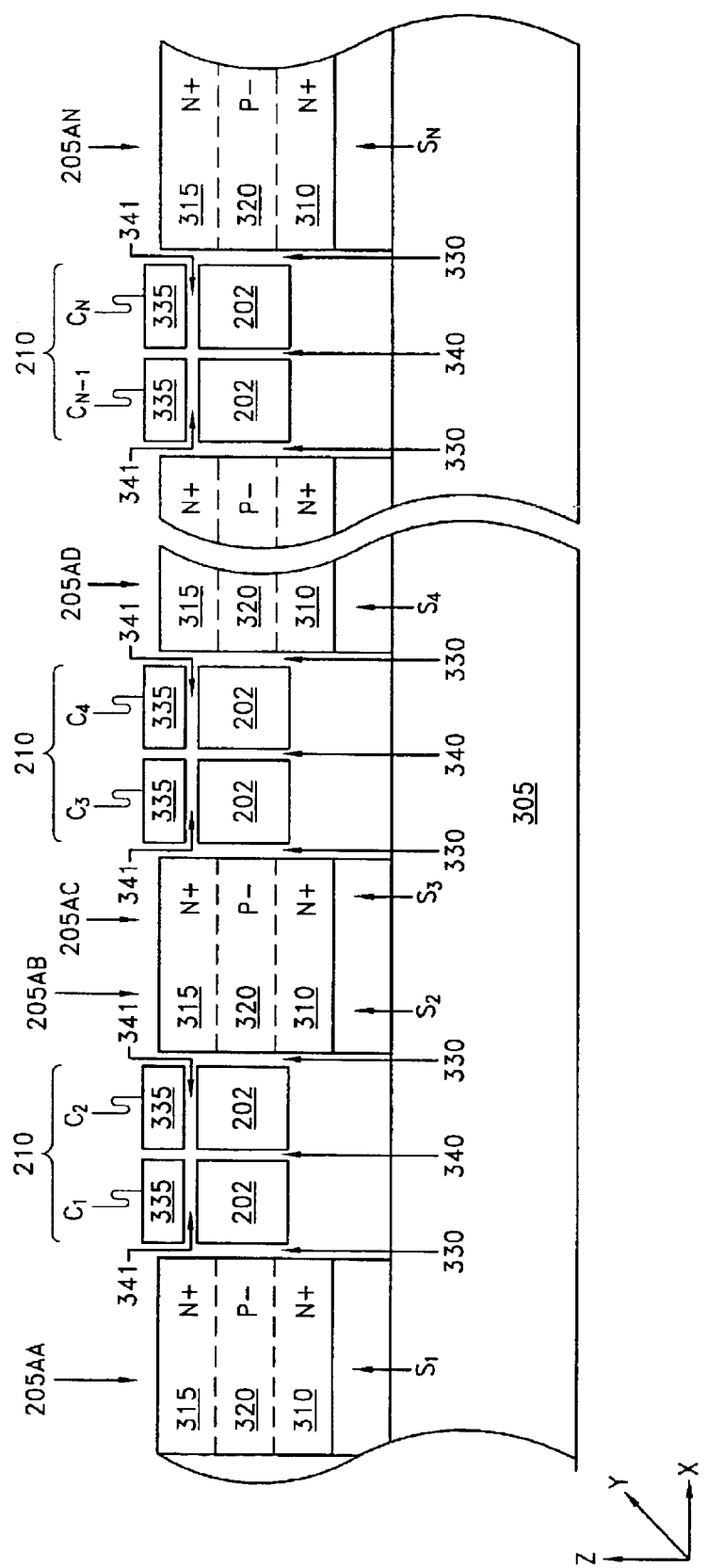
FIG. 9B is a cross-sectional view of the array of FIG. 9A looking perpendicular to output lines OL1–OLN.

FIG. 9B is a cross-sectional view of the array of FIG. 9A looking perpendicular to the output lines OL1–OLN, e.g., in the Y-dimension. FIG. 9B illustrates a row of logic cells 205AA, 205AB . . . 205AN, having source regions 310 interconnected by one of the source interconnection lines S1, S2 . . . SN. In one embodiment, the source interconnection lines are connected to ground.

Figure 10:
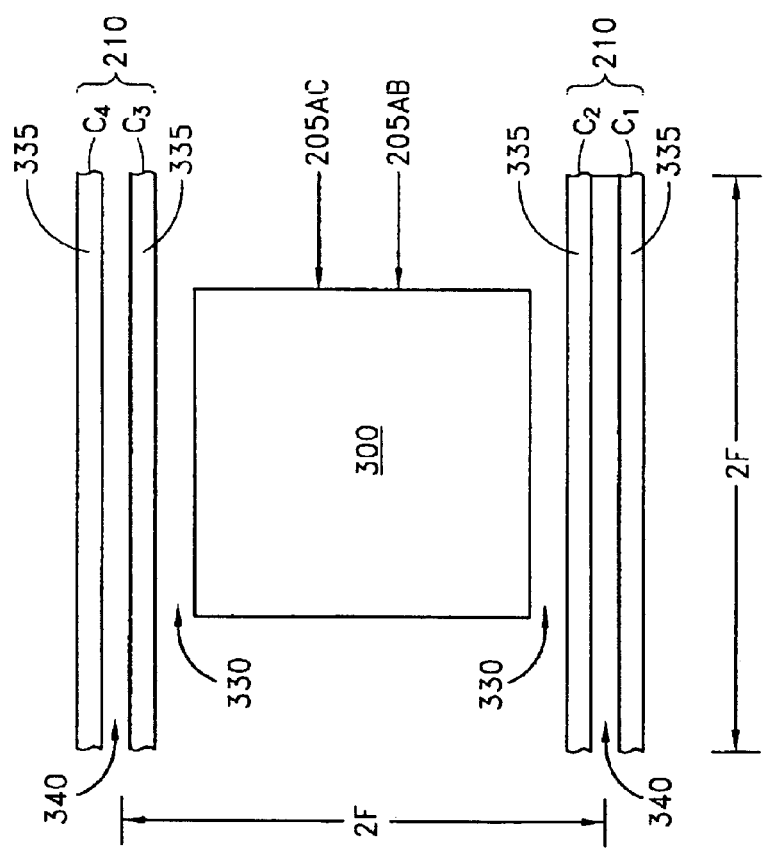
FIG. 10 is a plan view looking toward the working surface of a substrate, illustrating one embodiment of logic cells.

FIG. 10 is a plan view looking toward the working surface of a substrate 305, illustrating one embodiment of cells, e.g. logic cells 205AB and 205AC. Two control gates 335 with corresponding underlying floating gates 202 are adjacent to two opposing sides of a pillar 300 and separated therefrom by a gate dielectric 330. Each of the control gates 335 is separated from its corresponding underlying floating gate 202 by an intergate dielectric 341. The adjacent control gates 335 and the adjacent floating gates 202 are likewise separated by an intergate dielectric 340. The control gates 335 are integrally formed together with respective control lines C1–CN 210.

The center-to-center spacing ("pitch") between the control gates 335 that are on opposite sides of the pillar 300 is twice the minimum lithographic feature size F. An area of $4F^2$ contains two floating gate transistors 200, thereby implementing two logic cells 205AB and 205AC. Thus, each cell occupies an effective area of $2F^2$.

Figure 11:
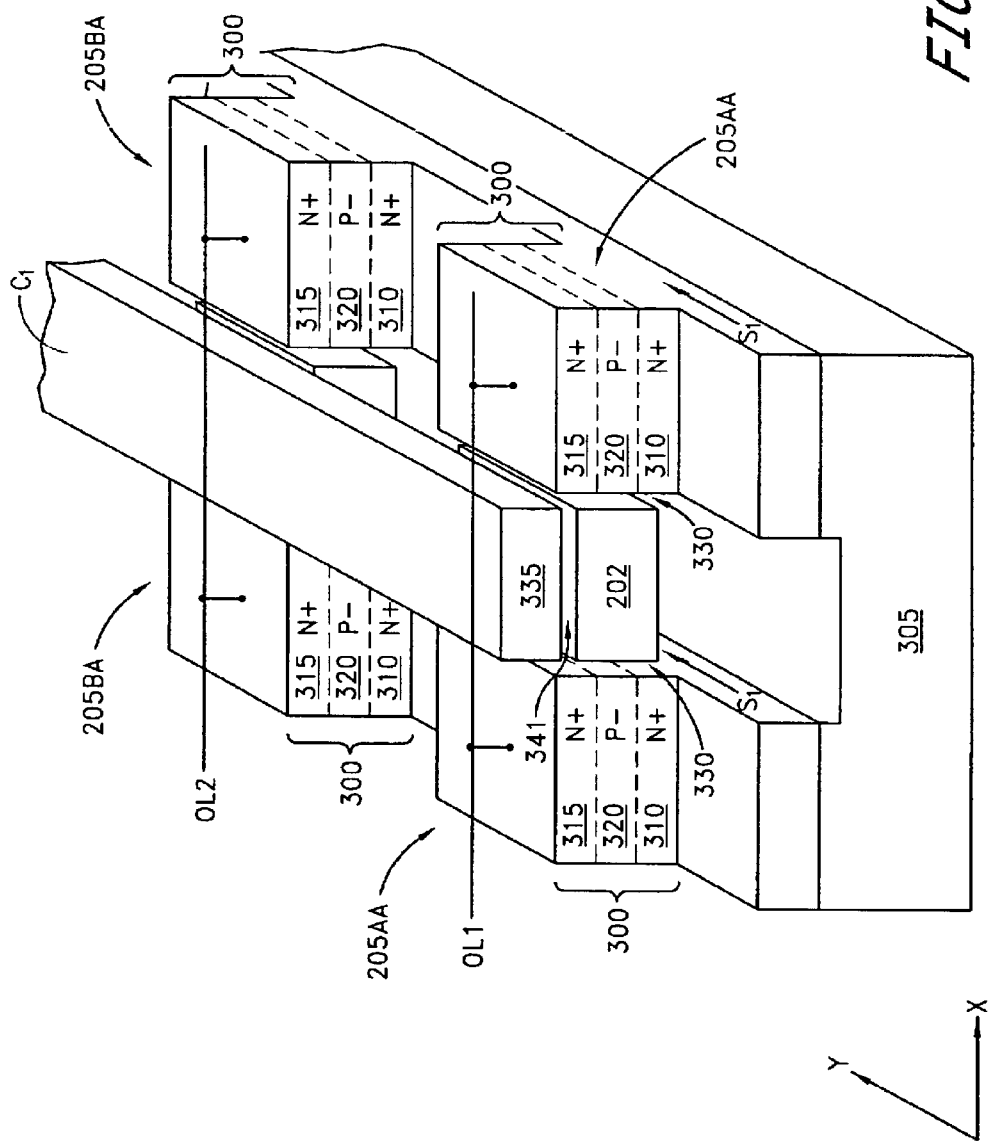
FIG. 11 is a perspective view of an alternate embodiment of vertical transistors with horizontal gate layers, illustrated by a portion of an array having a single control gate.

FIG. 11 is a perspective view of an alternate embodiment of vertical transistors with horizontal gate layers 335, 202, illustrated by a portion of an array having a single control gate 335. For example, the embodiment of FIG. 11 is a portion of the completed FPLA 141, including two logic cells 205AA and 205BA, as illustrated in FIGS. 8A and 8B.

In the single control gate embodiment, the single control gate 335 controls the two transistors 200 on opposite sides of the control gate 335. Each of the logic cells 205 has two transistors 200 operated from a common control gate 335, e.g., a single control line C1 210. This is in contrast to the split control gate embodiment where only one transistor 200 is operated by a single control line 210.

Figure 12:
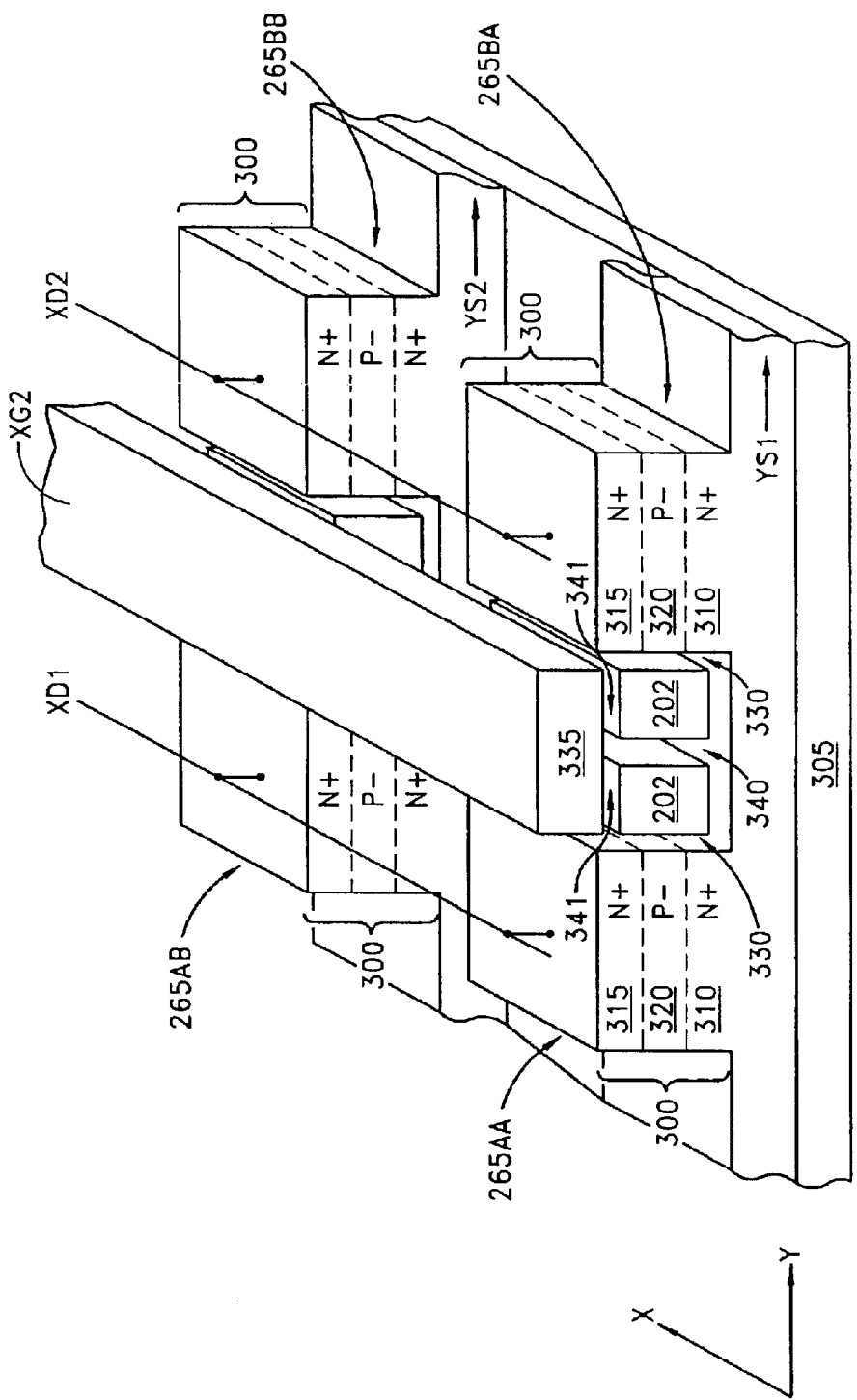
FIG. 12 is a perspective view of another embodiment of vertical transistors with horizontal gate layers, illustrated by a portion of an array having a single control gate overlaying split floating gates.

FIG. 12 is a perspective view of another embodiment of vertical transistors with horizontal gate layers, illustrated by a portion of an array having a single control gate (e.g. XG2) 335 overlaying split floating gates 202. For example, the embodiment of FIG. 12 is a portion of the completed memory cell array 106, including four logic cells 265AA, 265A18, 265 BA and 265BB.

The source regions of the logic cells 265AA and 265BA are connected by a first source/drain interconnection line YS1, while the source regions of logic cells 265AB and 265BB are connected by a first source/drain interconnection line YS2. The drain regions of the logic cells 265AA and 265AB are connected by second interconnection line XD1, while the drain regions of logic cells 265BA and 286BB are connected by second interconnection line XD2.

In the embodiment of FIG. 12, the single control gate 335 overlays the split floating gates 202. The single control gate 335 runs along the X dimension. The split floating gates 202 allow the overlying single control gate 335 to separately control the transistors 200 on either sides of the control gate 335, thereby controlling adjacent logic cells of the memory cell array 106.

FIGS. 13–19 illustrate one embodiment of a method of forming vertical body transistors 200 with horizontal gate layers 202, 253 in the memory cell array 106 partially shown in FIG. 12. A silicon semiconductor substrate is oxidized and then pillars of oxide are etched into the substrate. Layers of oxide and silicon nitride are deposited to act as the etch mask for forming the pillars and later as a CMP etch stop. The pillars can be formed on different types of substrates, including lightly doped P-type substrate, silicon on insulator substrates (e.g., SIMOX), and islands of silicon on insulator.

In this embodiment, the memory cell array 106 is formed using bulk silicon processing techniques and is described, by way of example, with respect to a particular technology having a minimum lithographic feature size F, which is also sometimes referred to as a critical dimension (CD), of 0.4 microns. However, the process steps described below can be scaled accordingly for other minimum feature sizes without departing from the scope of the invention.

The term "horizontal" as used in this application is defined as a plane parallel to the conventional plane or surface of a wafer or substrate, regardless of the orientation of the wafer or substrate. The term "vertical" refers to a dimension perpendicular to the horizontal plane as defined above. Prepositions, such as "on," "side" as in sidewall, "higher," "lower," "over," and "under" are defined with respect to the conventional plane or surface being the top surface of the wafer or substrate, regardless of the orientation of the wafer or substrate.

Figure 13:
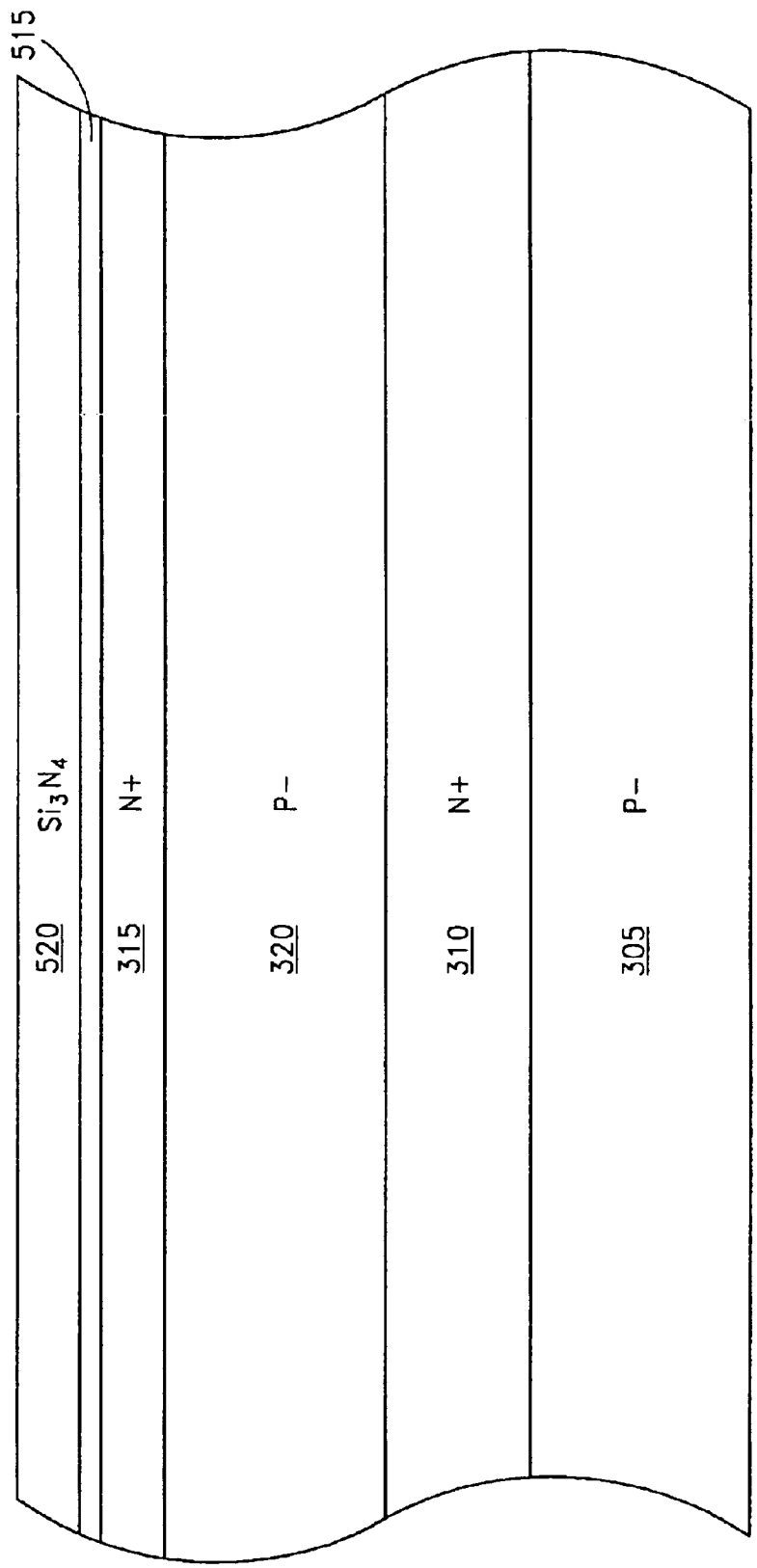
FIG. 13 illustrates a side view of a plurality of source/drain layers on top of a substrate material for forming vertical transistors.

FIG. 13 illustrates a side view of a plurality of source/ drain layers on top of a substrate material 305, which serve as initial materials for forming vertical transistors 200 in the memory cell array 106. A P− silicon starting material is used for the substrate 305. A source layer 310, of approximate thickness between 0.2 microns and 0.5 microns, forms at a working surface of the substrate 305. In one embodiment, the source layer 310 is N+ silicon formed by ion-implantation of donor dopants into the substrate 305. In another embodiment, the source layer 310 is N+ silicon is formed by epitaxial growth of silicon upon the substrate 305. A semiconductor epitaxial layer 320, such as P− silicon of 0.6 microns approximate thickness, forms (e.g., by expitaxial growth) on top of the source layer 310.

A drain layer 315, such as N+ silicon of 150 nanometers approximate thickness, forms at the surface of the epitaxial layer 320. The drain layer forms by ion-implantation of donor dopants into the P− epitaxial layer 320 or by epitaxial growth of N+ silicon on the P− epitaxial layer 320. A thin layer of silicon dioxide ($SiO_2$), referred to as pad oxide 515, is deposited on top of the drain layer 315. The pad oxide 515 is approximately 10 nanometers thick. A layer of silicon nitride ($SiN_4$), referred to as pad nitride 520, is deposited on top of the pad oxide 515. The pad nitride 520 is approximately 100 nanometers thick.

Figure 14:
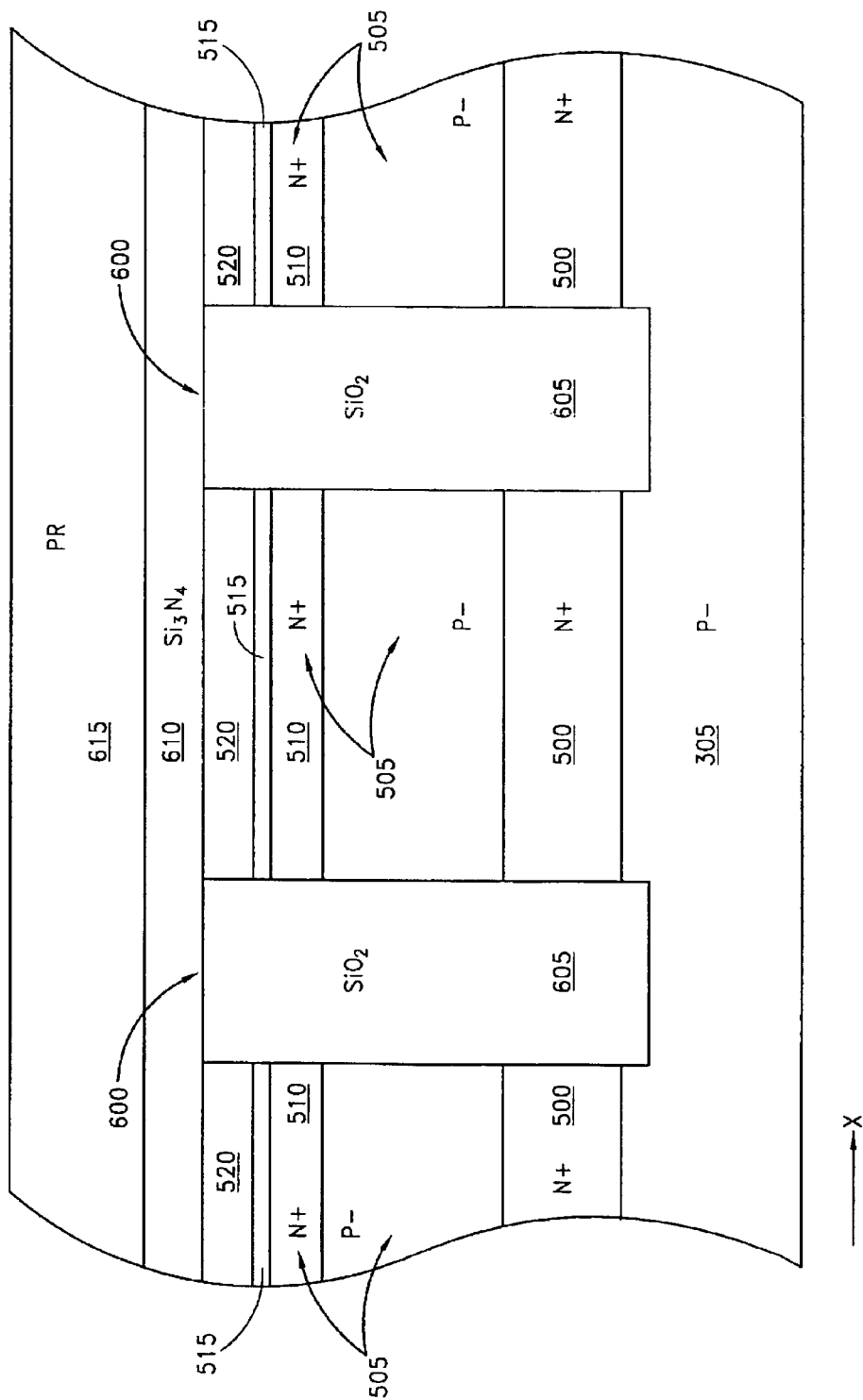
FIG. 14 illustrates a plurality of first troughs extending through a plurality of layers formed on top of a substrate material.

FIG. 14 illustrates a plurality of first troughs 600 extending through a plurality of layers 520, 515, 315, 320, 310 formed on top of the substrate material 305. Photoresist masking and selective etching techniques are used to form the plurality of substantially parallel first troughs 600 in the first dimension, e.g., along the Y-dimension which is perpendicular to the plane of the drawing of FIG. 14. The first troughs 600 extend through the underlying pad nitride 520, the underlying pad oxide 515, the underlying drain layer 315, the underlying epitaxial layer 320, the underlying source layer 310, and at least partially into the underlying P− silicon substrate 305.

Conventional photoresist stripping techniques remove photoresist after formation of the first troughs 600. Then, insulation material 605 fills the first troughs 600. In one embodiment, the insulation material 605 is silicon dioxide deposited by chemical vapor deposition (CVD), covering the first troughs 600 and the surrounding surfaces. The insulator material 605 is planarized, e.g., removed from the surfaces surrounding the first troughs 600 to expose underlying portions of the pad nitride 520, such as by chemical mechanical polishing (CMP) or other suitable planarization technique. A masking layer 610, such as silicon nitride deposited by CVD, of approximately 200 nanometers thick forms on the insulator 605 and elsewhere on the working surface of the substrate 305. A photoresist layer 615 forms on top of the masking layer 610.

Figure 15:
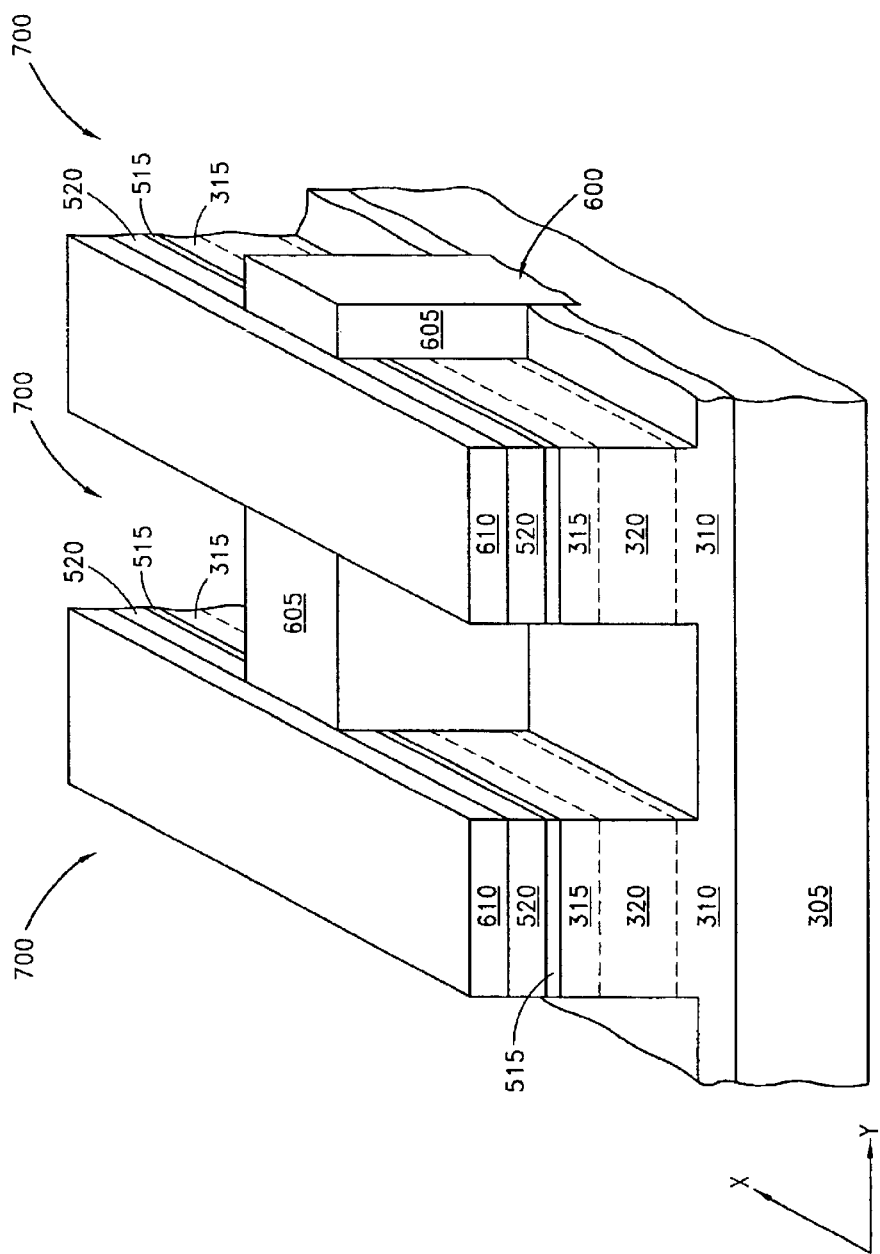
FIG. 15 is a perspective view of a plurality of second troughs orthogonal to the first troughs of FIG. 14.

FIG. 15 is a perspective view of a plurality of second troughs 700 orthogonal to the first troughs 600 of FIG. 14, further illustrating selective etching. Photoresist masking and selective etching techniques are used to form a plurality of substantially parallel second troughs 700 in the second dimension, e.g., along the X-dimension that is substantially perpendicular to the Y-dimension. Formation of the second troughs 700 includes patterning the photoresist layer 615 and selectively etching the masking layer 610 along with the underlying pad nitride 520 and the underlying pad oxide 515 to expose portions of the silicon dioxide insulation 605 and the N+ drain layer 315 in the second troughs 700. Then, a selective etch which preferentially removes silicon but does not substantially removes silicon dioxide etches through the exposed portions of the drain layer 315, the underlying portions of the epitaxial layer 320, and approximately 100 nanometers into the underlying portions of the source layer 310. Conventional photoresist stripping techniques remove the photoresist 615 resulting in the structure illustrated in FIG. 15. FIG. 15 illustrates pillars which form the vertical bodies of the transistors 200 and trenches for gate layers.

Figure 16:
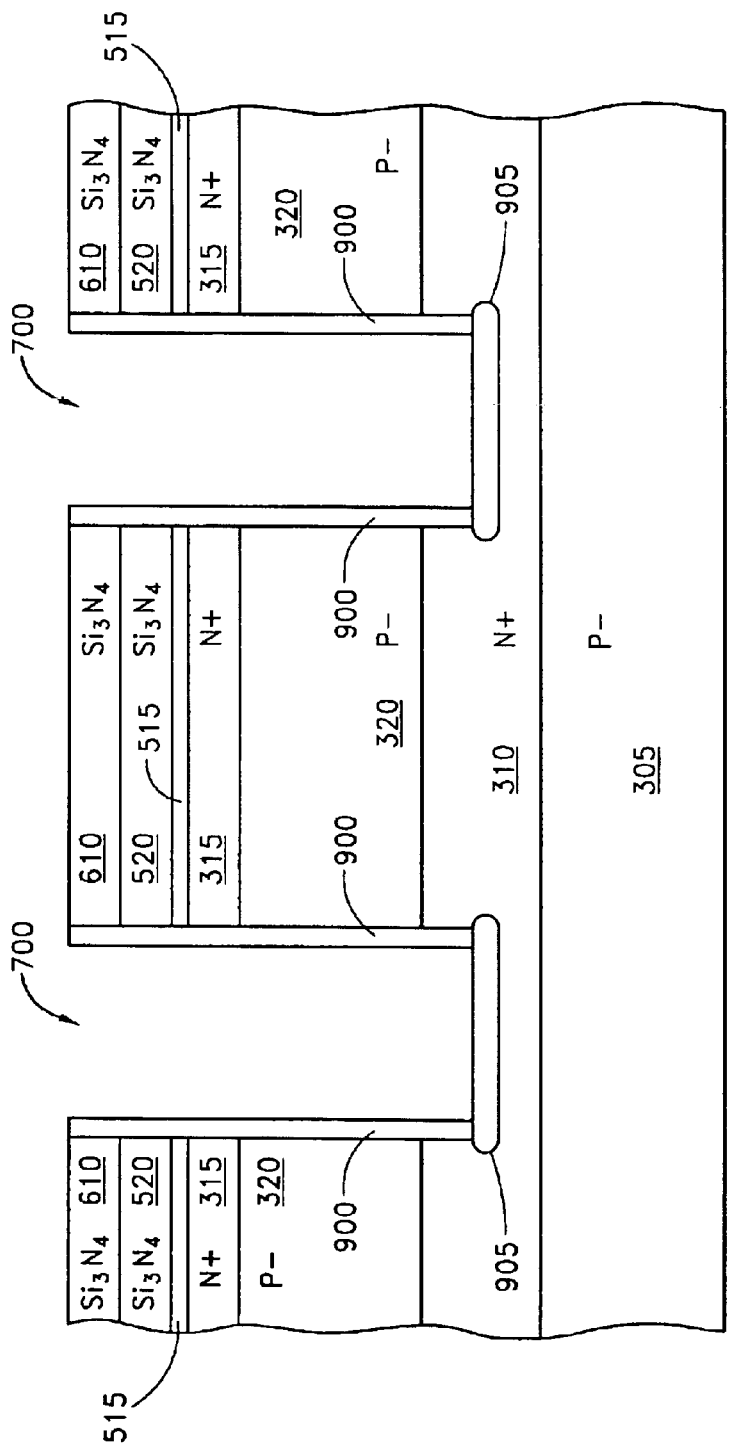
FIG. 16 is a cross-sectional view looking in the direction of the second troughs of FIG. 15.

FIG. 16 is a cross-sectional view looking in the direction of the second troughs 700 of FIG. 15, i.e., in the X-dimension orthogonal to the plane of the illustration. A thin oxidation barrier layer 900, such as silicon nitride of approximately 20 nanometers thick, is conformally deposited by CVD to mask (i.e., to protect against oxidation of) the sidewalls of the second troughs 700. The barrier layer 900 is directionally etched after deposit to expose bottom portions of the second troughs 700, leaving the silicon nitride on the sidewalls.

Bottom insulation layers 905, high quality oxide for isolation, are formed on the bottoms of the second troughs 700 to insulate interconnection lines connecting the source regions 310 of the transistors 200, e.g., the first source/drain interconnection lines YS1, YS2 . . . YSN in the memory cell array 106. In one embodiment, the bottom insulation layers 905 are silicon dioxide formed by thermal oxidation of the exposed bottom portions of the second troughs 700. The silicon dioxide has a thickness of approximately 100 nanometers.

Figure 17:
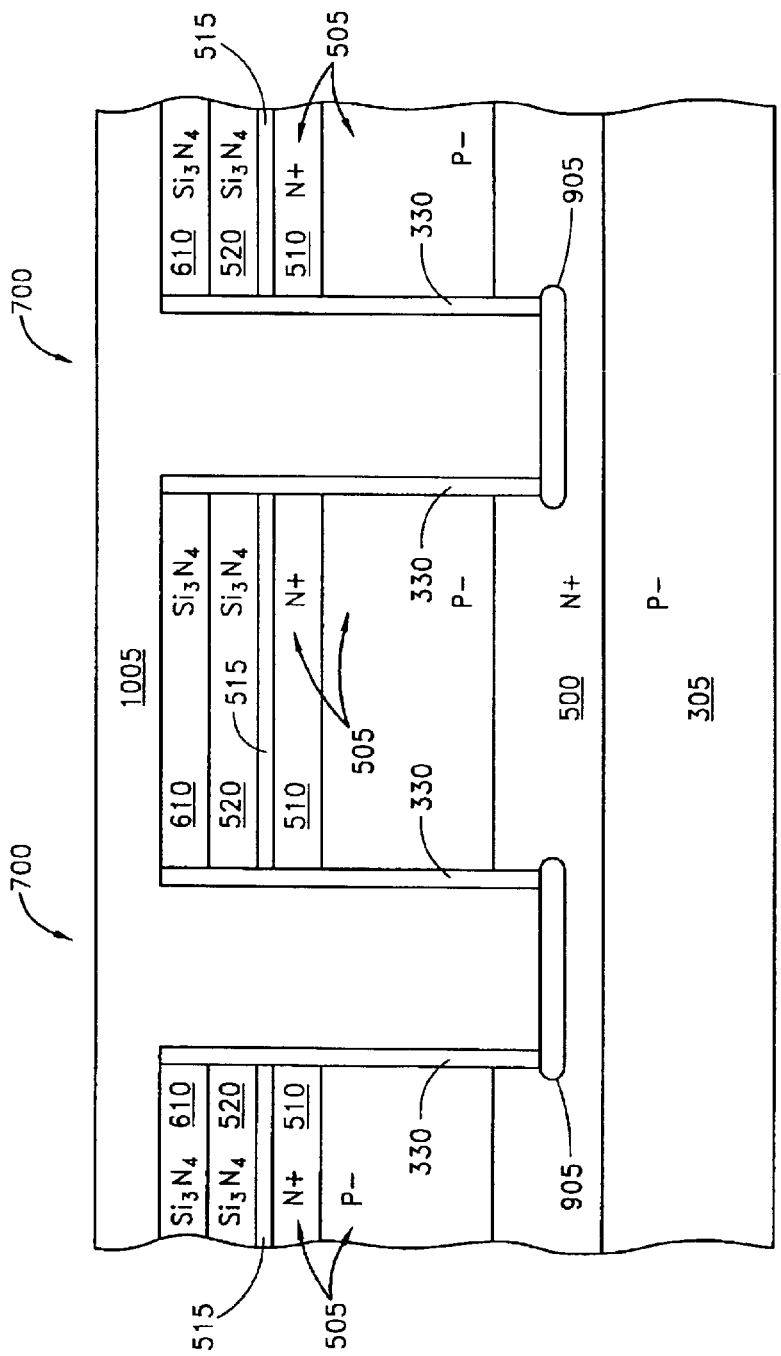
FIG. 17 is a cross-sectional view looking in the direction of the second troughs of FIG. 16, illustrating a barrier layer stripped from the sidewalls of the second troughs.

FIG. 17 is a cross-sectional view looking the direction of the second troughs 700 of FIG. 16, illustrating the barrier layer 900 stripped from the sidewalls of the second troughs 700. In FIG. 17, brief phosphoric acid etch strips the barrier layers 900 from the sidewalls of the second troughs 700. The brief phosphoric acid etch is timed to expose the sidewalls of the second troughs 700 without significant removal of the thick silicon nitride masking layer 610. Gate dielectric layers 330 form substantially adjacent to the exposed sidewalls of the respective second troughs 700. In one embodiment, the gate dielectric layers 330 are silicon dioxide, sometimes referred to as "tunnel oxide," with a thickness approximately between 4 nanometers and 8 nanometers. Conductive layers 1005, such as N+ doped polysilicon, form by CVD to fill the respective second troughs 700. The conductive layers 1005 are planarized by CMP or other suitable planarization techniques.

Figure 18:
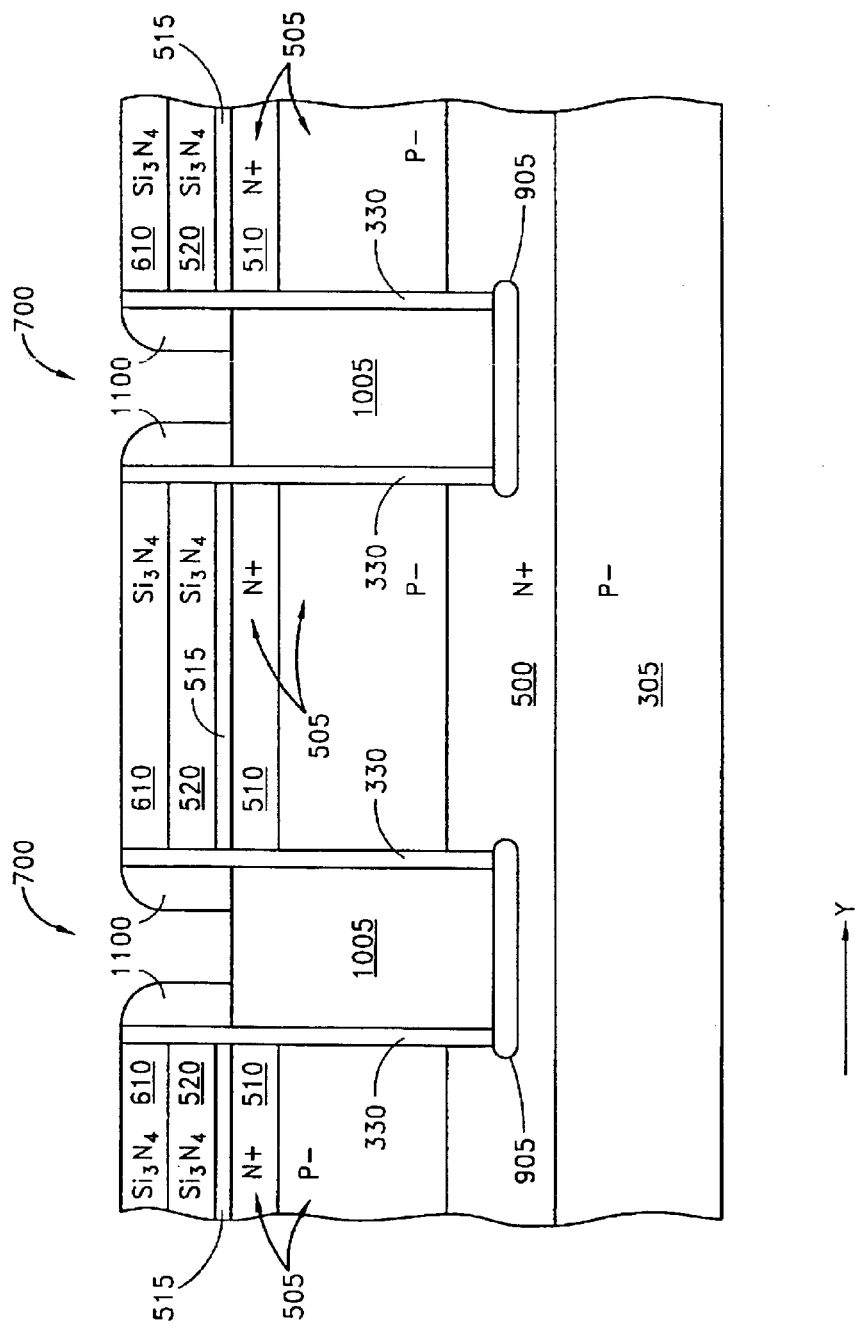
FIG. 18 is a cross-sectional view looking in the direction of the second troughs of FIG. 17, illustrating a conductive layer in the second troughs.

FIG. 18 is a cross-sectional view looking in the direction of the second troughs 700 of FIG. 17, illustrating a conductive layer in the second troughs. In FIG. 18, the conductive layers 1005 are etched back in the second troughs 700 to approximately at or slightly above the level of the silicon surface which is defined by the interface between the drain layers 315 and the pad oxides 515. A spacer layer, such as silicon nitride approximately 100 nanometers in thickness, is deposited by CVD and directionally etched by reactive ion etching (RIE) to leave nitride spacers 1100 along the sidewalls of the second troughs 700, i.e., on the etched back portions of the conductive layers 1005, on portions of the insulation 605 in the intersection of the first troughs 600 and the second troughs 700, and against the gate dielectric layers 330.

Figure 19:
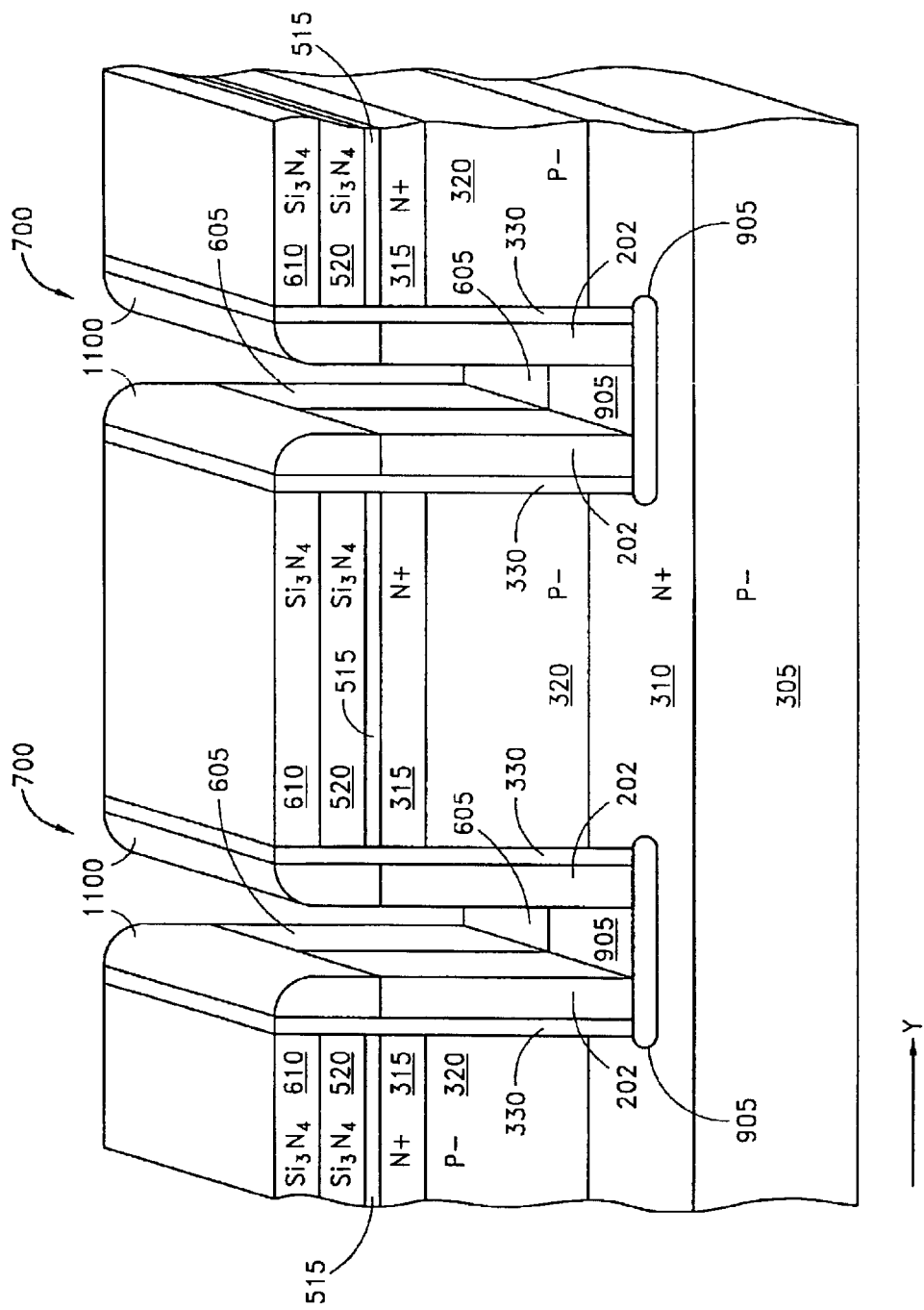
FIG. 19 is a perspective view of the second troughs of FIG. 18, illustrating spacers positioned for use as a mask.

FIG. 19 is a perspective view of the second troughs 700 of FIG. 18, illustrating the spacers 1100 positioned for use as a mask. The spacers 1100 are masks for anisotropic etching in the second troughs 700 of the etched back portions of the polysilicon conductive layer 1005 and portions of the silicon dioxide insulation 605. A selective etch which removes silicon dioxide without substantially removing polysilicon etches into portions of the silicon dioxide insulation 605 without disturbing the portions of the polysilicon conductive layers 1005 in the second troughs 700.

The portions of the silicon dioxide insulation 605 in the second troughs 700 are etched until they are approximately even with adjacent portions of the bottom insulation layer 905. Then, a selective etch which removes polysilicon without substantially removing silicon dioxide etches through portions of the conductive layers 1005 in the second troughs until the bottom insulation layers 905 is exposed, thereby forming separate floating gates 202 along the sidewalls of the second troughs 700.

Referring back to FIG. 12, the intergate dielectric 340 is formed in the second troughs 700 by filling the space between the floating gates 202 with deposited oxide. The oxide is deposited and planarized to the level of the masking layer 610. Then, the oxide is etched back to approximately the level defined by the interface between the drain layers 315 and the pad oxides 515. Next, silicon nitride (e.g., from the masking layer 610, the pad nitride 520 and the spacers 1100) is removed. In one embodiment, phosphoric acid is used to remove the silicon nitride.

The intergate dielectric 341 is formed by growing thermal control gate oxide or depositing oxynitride approximately 8 to 20 nanometers in thickness above the floating gates 202. The control gate 335 of approximately 200 nanometers thick is formed by depositing suitable gate material, such as N+ doped polysilicon, on top of the floating gates 202. In one embodiment, the N+ doped polysilicon is deposited by CVD and patterned into horizontal bars above the floating gates 202. Finally, an oxide layer (not shown), deposited by CVD, covers the working surface for the subsequent steps of creating contact holes, terminal metal, and inter level insulation to complete wiring of the cells and peripheral circuits.

Figure 20:
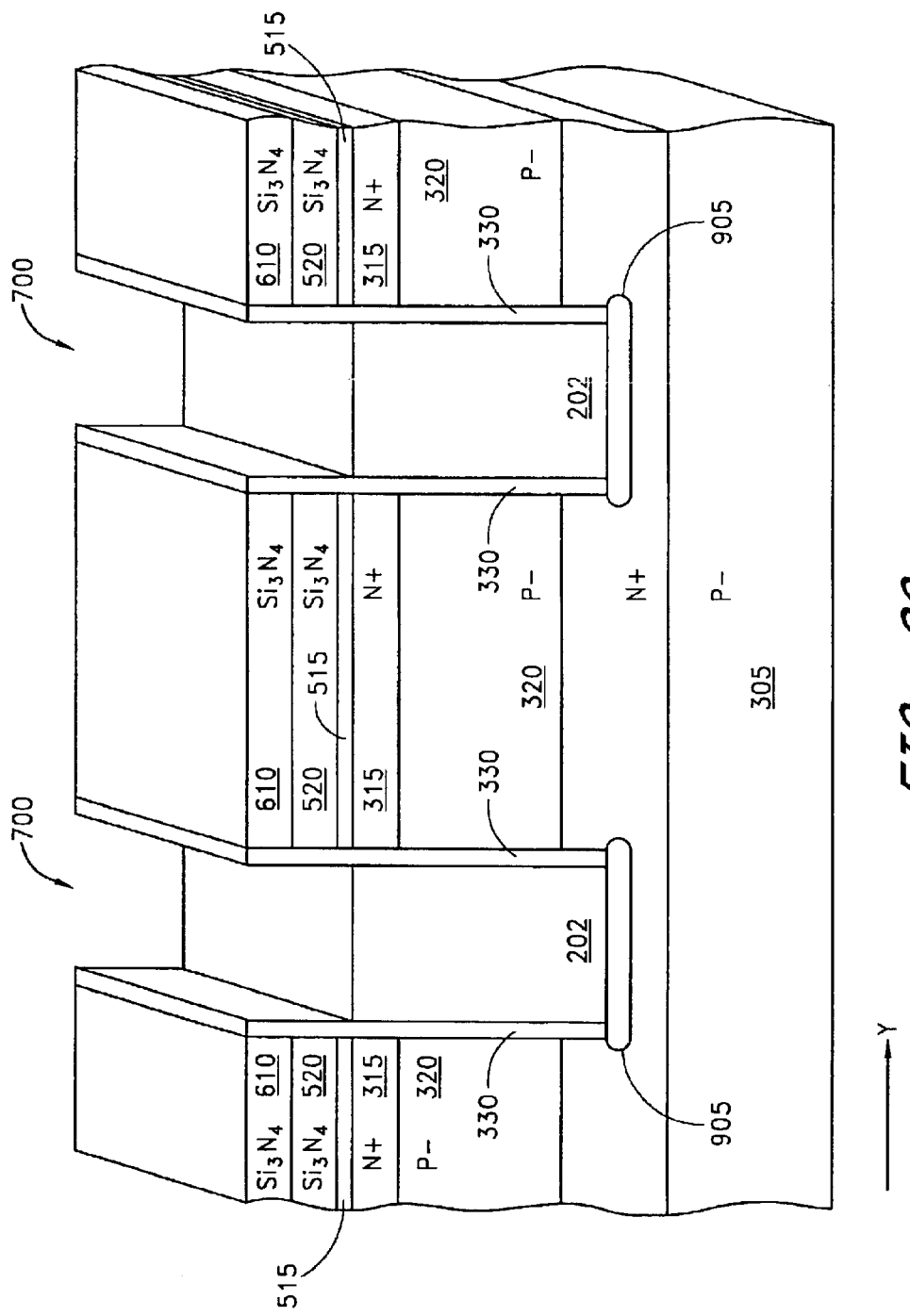
FIG. 20 is a perspective view of the second troughs of FIG. 17, illustrating an alternate method of forming vertical transistors with horizontal gate layers.

FIG. 20 is a perspective view of the second troughs 700 of FIG. 17, illustrating an alternate method of forming vertical transistors 200 with horizontal gate layers 335, 202. In FIG. 20, the conductive layers 1005 are etched back in the second troughs 700 to approximately at or slightly above the level of the silicon surface which is defined by the interface between the drain layers 315 and the pad oxides 515, thereby forming floating gates 202. Then intergate dielectric 341 is formed by growing thermal control gate oxide or depositing oxynitride approximately 8 to 20 nanometers in thickness above the floating gates 202. Control gates 335 of approximately 200 nanometers thick are formed by depositing and planarizing suitable gate material, such as N+ doped polysilicon, on top of the intergate dielectric 341. In one embodiment, the N+ doped polysilicon is deposited by CVD and patterned into horizontal bars above the floating gates 202, resulting in the vertical transistors 200 of FIG. 11 with single control gates 335.

Figure 21:
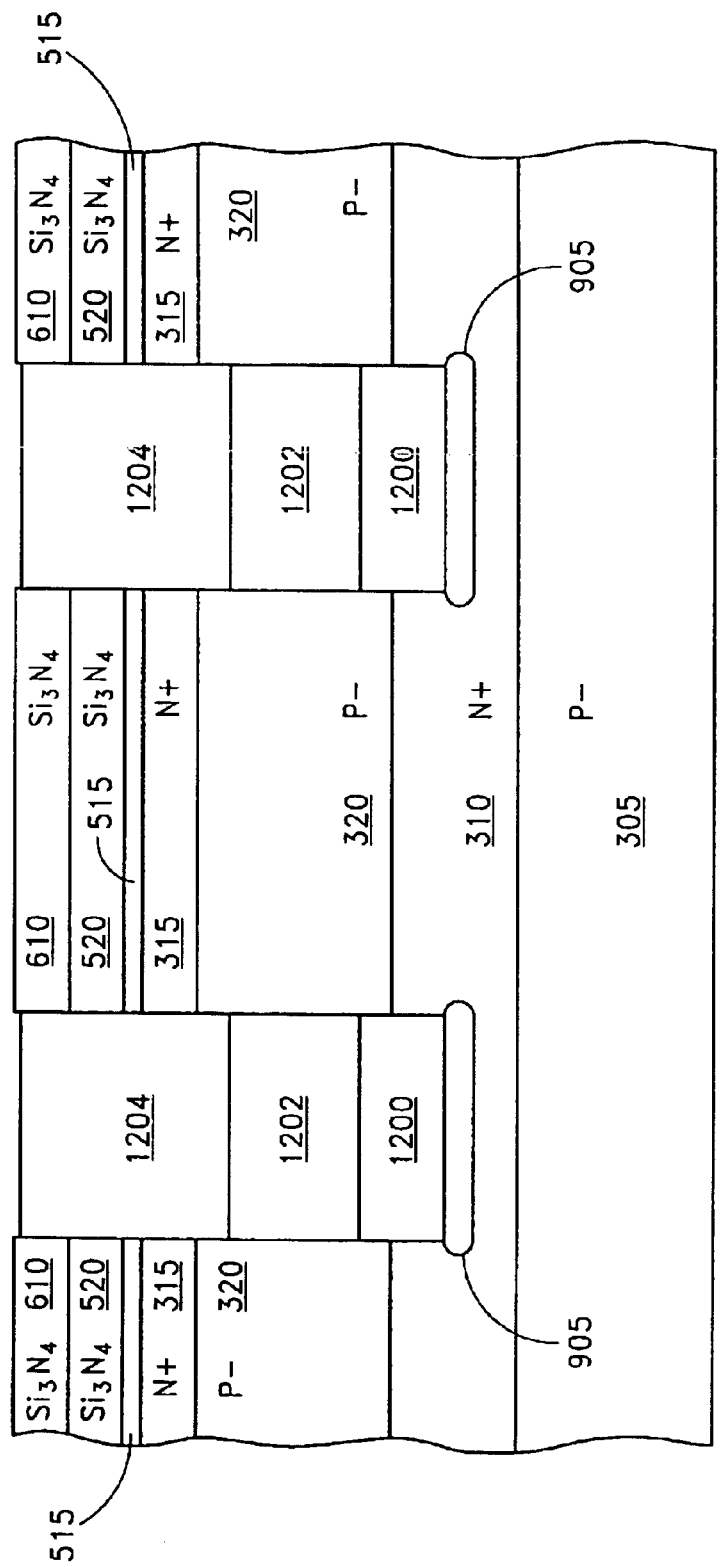
FIG. 21 is a cross-sectional view looking in the direction of the second troughs of FIG. 16, illustrating yet another method of forming vertical transistors with horizontal gate layers.

FIG. 21 is a cross-sectional view looking in the direction of the second troughs 700 of FIG. 16, illustrating yet another method of forming vertical transistors 200 with horizontal gate layers 335, 202. The barrier layers 900 of FIG. 16 are stripped from the sidewalls of the second troughs 700 using brief phosphoric acid.

A first layer 1200 is deposited, planarized and etched back in the second troughs 700 to approximately at or above the level of the surface which is defined by the interface between the source region 310 and the body region 320. A second layer 1202 is then deposited on top of the first layer 1200, planarized, and etched back in the second troughs 700 to approximately at or below the level of the surface which is defined by the interface between the body region 320 and the drain region 315. Finally, a third layer 1204 is deposited on top of the second layer 1202 and planarized.

In one embodiment, the first layer 1200 and the third layer 1204 are doped materials, such as N+ doped oxide. The second layer 1202 is an undoped material, such as undoped oxide. In an alternate embodiment, the second layer 1202 is undoped polysilicon.

Figure 22:
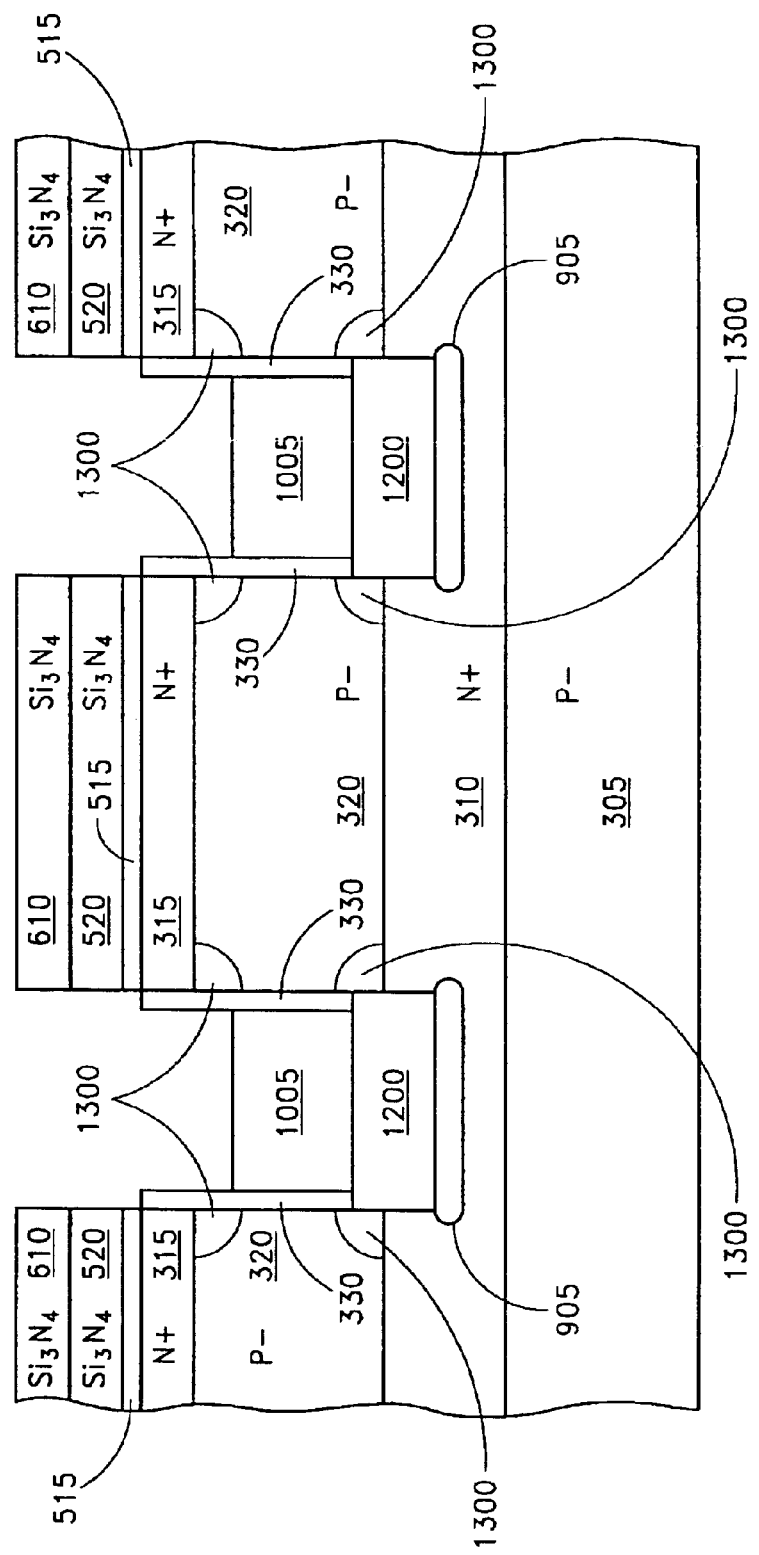
FIG. 22 is a cross-sectional view looking in the direction of the second troughs of FIG. 21, illustrating gate length control and a self-aligned transistor structure.

The structure of FIG. 21 is then heat treated to form lightly doped source/drain regions 1300 shown in FIG. 22. The lightly doped source/drain regions 1300 are in the vicinity of the contact surfaces between the first layer 1200 or the third layer 1204 and the body region 320. Diffusion of dopants in the first layer 1200 and the third layer 1204 during the heat treatment results in the lightly doped source/ drain regions 1300 in the body region 320.

FIG. 22 is a cross-sectional view looking in the direction of the second troughs of FIG. 21, illustrating gate length control and self-aligned transistor structures. In one embodiment, the second layer 1202 is a sacrificial gate layer which defines a gate length of the transistor 200. The sacrificial gate layer 1202 is selectively removed and replaced with a floating gate 202 in a subsequent step.

For example, the third layer 1204 is removed after the heat treatment that produces the lightly doped source/drain regions 1300. Gate dielectric layers 330, such as gate oxide, are grown substantially adjacent to the exposed sidewalls of the respective second troughs 700. The sacrificial gate layer 1202 is then selectively removed and replaced with a conductive layer 1005, such as doped polysilicon.

Based on the structure of FIG. 22, techniques described above can be used to form various embodiments of the vertical body transistors 200. For example, techniques shown in FIGS. 18 and 19 are used to form vertical body transistors 200 with split floating gates. Techniques shown in FIG. 20 are used to form vertical body transistors 200 with a single floating gate.

The lightly doped source/drain regions 1300 act as extensions of the source and drain regions 310, 315. The lightly doped source/drain regions 1300 reduce the channel or gate length which is the distance next to the floating gate 202 in the body region 320 between the source region 310 and the drain region 315. The thickness of the second layer 1202 partially controls the channel length during the heat treatment described in FIG. 21. When the floating gate 202 replaces the second layer 1202, minimal gate overlaps occur with the lightly doped source/drain regions.

Though FIGS. 13–22 illustrate various embodiments of forming the vertical body transistors 200 using bulk silicon processing techniques, other processing techniques can be used. In one embodiment, a semiconductor-on-insulator (SOI) substrate is formed from a substrate 305. For example, a P− silicon starting material is used for the substrate 305, and processing begins similarly to the bulk semiconductor embodiment described in FIG. 13. However, after the first troughs 600 are formed in FIG. 14, an oxidation barrier layer is formed on the sidewalls of the first troughs 600. An isotropic chemical etch is used to fully undercut the semiconductor regions separating the first troughs 600, and a subsequent oxidation step is used to fill the evacuated regions formed by the undercutting. As a result, an insulator is formed on the bottoms of the first troughs 600, bars of SOI are formed between first troughs 600, and the topography on the working surface of the substrate 305 is separated from the substrate 305 by an insulating layer. The barrier layer is then removed from the sidewalls of the first troughs 600, which are then filled with insulator 605, as illustrated in FIG. 14.

Thus, in the above described figures, the substrate 305 is understood to include bulk semiconductor as well as SOI embodiments in which semiconductor integrated circuits formed on the surface of the substrate 305 are isolated from each other and an underlying semiconductor portion of the substrate 305 by an insulating layer. One such method of forming regions of SOI is described in U.S. Pat. No. 5,691,230 issued to Forbes and assigned to the assignee of the present application, and which is herein incorporated by reference.

A common problem among the programmable memories and the related FPLAs is a large cell size, which limits circuit density. The cell size can be decreased, thereby increasing the circuit density, by introducing a novel physical structure for the floating gate transistors.

The present invention provides a novel structure for floating gate transistors 200 which improves circuit density. For example, if a floating gate transistor 200 is used to store a single bit of data in the memory cell array 106, an area of only $2F^2$ is needed per bit of data. If multiple charge states (more than two) are used, even less area is needed per bit of data, e.g., an area of $F^2$ is needed per bit of data when four charge states are used. The increased storage capacity of the memory cell array 106 is particularly advantageous in replacing hard disk drive data storage in a computer 10. In such an application, the delicate mechanical components included in the hard disk drive are replaced by rugged, small, and durable solid-state high density memory cell arrays 106, such as EEPROMs. For example, high density flash EEPROMs provide improved performance, extended rewrite cycles, increased durability, lower power consumption, and improved portability.

Although described above in connection with particular embodiments of the present invention, it should be understood that the descriptions of the embodiments are illustrative of the invention and are not intended to be limiting. Various modifications and applications may occur to those skilled in the art without departing from the true spirit and scope of the invention as defined in the appended claims.

What is claimed is:

1. A floating gate transistor comprising:
   a pillar of semiconductor material that extends outwardly from a working surface of a substrate to form a source region, a body region and a drain region of a floating gate transistor;
   a floating gate along one side of the pillar, wherein the floating gate overlaps the body region in a horizontal direction; and
   a control gate overlaying the floating gate, wherein the portion of the control gate overlapping the floating gate does not overlap the body region in either the horizontal direction or a vertical direction.

2. The floating gate transistor of claim 1, wherein charges are selectively stored in the floating gate in programming the floating gate transistor.

3. The floating gate transistor of claim 1, wherein the pillar is formed by etching.

4. The floating gate transistor of claim 1, wherein an absence or a presence of stored charges on the floating gate determines a conductivity state of the transistor between the source region and the drain region.

5. The floating gate transistor of claim 1, wherein the substrate is a bulk semiconductor substrate.

6. The floating gate transistor of claim 1, wherein the substrate is a silicon-on-insulator substrate.

7. The floating gate transistor of claim 2, wherein hot electron injection is used to program the floating gate transistor.

8. The floating gate transistor of claim 2, wherein Fowler-Nordheim tunneling is used to program the floating gate transistor.

9. An array of floating gate transistors comprising:
   a plurality of semiconductor stacks arranged in rows and in columns, wherein each stack forms source, body, and drain regions of a respective floating gate transistor;
   a plurality of floating gates in trenches between the columns of semiconductor stacks, wherein the floating gates are separated from respective sides of the semiconductor stacks by a gate dielectric; and
   a plurality of control gates overlaying the respective floating gates and separated from the respective floating gates by an intergate dielectric, wherein the control gates in vertical alignment with the respective floating gates do not align with the body regions in either a horizontal direction or a vertical direction.

10. The array of claim 9, wherein etching is used to form the plurality of semiconductor stacks which extend vertically from a substrate.

11. The array of claim 9, wherein each of the respective floating gate transistors extend outwardly from a substrate with a source region formed proximally to the substrate, a body region above the source region, and a drain region above the body region.

12. The array of claim 11, wherein two floating gates lie adjacent to each other in each trench between the columns of semiconductor stacks, and one control gate overlays the adjacent floating gates.

13. The array of claim 11, wherein one floating gate lie in each trench between the columns of semiconductor stacks, and one control gate overlays the floating gate.

14. The array of claim 11, wherein two floating gates lie adjacent to each other in each trench between the columns of the semiconductor stacks, and two corresponding control gates lie adjacent to each other above the floating gates.

15. The array of claim 12, wherein the array is a memory cell array with the source regions of common rows electrically connected to be first input selection lines, the control gates electrically connected along the direction of the columns to be second input selection lines, and the drain regions of common columns electrically connected to be output data lines.

16. The array of claim 13, wherein the array is a logic array with the source regions of a common column electrically coupled to be selection lines during programming of the logic array, the control gates electrically coupled along the direction of the columns to be inputs to the logic array, and the drain regions of a common row electrically coupled to be output lines of the logic array.

17. The array of claim 14, wherein the array is a field programmable logic array with the source regions of a common column electrically interconnected, the drain regions of a common row electrically interconnected, and the control gates interconnected along the direction of the columns.

18. The array of claim 15, wherein charges are stored in the floating gates to represent respective data in the memory cell array.

19. The array of claim 18, wherein hot electron injection is used to selectively place charges in the respective floating gates, thereby programming the respective floating gate transistors.

20. A floating gate transistor that is fabricated upon a substrate, the floating gate transistor comprising:

a first conductivity type semiconductor pillar formed upon the substrate, wherein the pillar has top and side surfaces;

a first source/drain region of a second conductivity type formed in a portion of the pillar that is proximal to an interface between the pillar and the substrate;

a second source/drain region of a second conductivity type formed in a portion of the pillar that is distal to the substrate and separated from the first source/drain region;

a gate dielectric formed on at least a portion of one side surface of the pillar;

a floating gate substantially adjacent to a body region defined by the separation between the first source/drain region and the second source/drain region, wherein the floating gate is separated from the body region by the gate dielectric;

an intergate dielectric formed on a top surface of the floating gate; and a control gate substantially overlaying the floating gate and insulated therefrom by the intergate dielectric, such that the portion of the control gate above the floating gate does not overlap the body region next to the floating gate in either a horizontal or vertical direction.

21. The floating gate transistor of claim 20, wherein electrical charges in the floating gate controls electrical conduction between the first source/drain region and the second source/drain region.

22. The floating gate transistor of claim 20, wherein the floating gate transistor is a data storage element in a programmable memory array with the data represented by charges stored in the respective floating gates.

* * * * *